United States Patent
Chiu et al.

(10) Patent No.: US 12,068,385 B2
(45) Date of Patent: Aug. 20, 2024

(54) OXIDATION TO MITIGATE DRY ETCH AND/OR WET ETCH FLUORINE RESIDUE

(71) Applicant: Taiwan Semiconductor Manufacturing Company, Ltd., Hsinchu (TW)

(72) Inventors: U-Ting Chiu, Hsinchu (TW); Chun-Cheng Chou, Taichung (TW); Chi-Shin Wang, Hsinchu (TW); Chun-Neng Lin, Hsinchu (TW); Ming-Hsi Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 288 days.

(21) Appl. No.: 17/446,218

(22) Filed: Aug. 27, 2021

(65) Prior Publication Data
US 2022/0336615 A1    Oct. 20, 2022

Related U.S. Application Data

(60) Provisional application No. 63/176,032, filed on Apr. 16, 2021.

(51) Int. Cl.
*H01L 29/45* (2006.01)
*H01L 21/311* (2006.01)
(Continued)

(52) U.S. Cl.
CPC ........ *H01L 29/45* (2013.01); *H01L 21/31116* (2013.01); *H01L 21/32134* (2013.01);
(Continued)

(58) Field of Classification Search
CPC .............. H01L 29/45; H01L 29/41725; H01L 29/0673; H01L 29/775; H01L 21/3111;
(Continued)

(56) References Cited

U.S. PATENT DOCUMENTS 5,849,639 A * 12/1998 Molloy .................. G03F 7/427
                                                    257/E21.256
8,436,405 B2    5/2013 Liaw
(Continued)

*Primary Examiner* — Shahed Ahmed
*Assistant Examiner* — Vicki B. Booker
(74) *Attorney, Agent, or Firm* — Harrity & Harrity, LLP

(57) ABSTRACT

In some implementations, fluorine is oxidized after dry etching an oxide layer above a source/drain contact and before cleaning. Accordingly, less hydrofluoric acid is formed during cleaning, which reduces unexpected wet etching of the source/drain contact. This allows for forming a recess in the source/drain contact with a depth to width ratio in a range from approximately 1.0 to approximately 1.4 and prevents damage to a layer of silicide below the source/drain that can be caused by excessive hydrofluoric acid. Additionally, or alternatively, the recess is formed using multiple wet etch processes, and any residual fluorine is oxidized between the wet etch processes. Accordingly, each wet etching process may be shorter and less corrosive, which allows for greater control over dimensions of the recess. Additionally, less hydrofluoric acid may be formed during cleaning processes between the wet etch processes, which reduces the etching of the source/drain contact between processes.

20 Claims, 21 Drawing Sheets

(51) Int. Cl.
*H01L 21/3213* (2006.01)
*H01L 21/768* (2006.01)
*H01L 23/528* (2006.01)
*H01L 29/417* (2006.01)

(52) U.S. Cl.
CPC ...... *H01L 21/76877* (2013.01); *H01L 23/528* (2013.01); *H01L 29/41725* (2013.01)

(58) Field of Classification Search
CPC ......... H01L 21/32134; H01L 21/76877; H01L 21/76814; H01L 21/76816; H01L 21/76888; H01L 21/02244; H01L 21/823431; H01L 21/02068; H01L 21/02063; H01L 21/823475; H01L 21/823418; H01L 23/528; H01L 23/5283; H10B 10/00; H10B 20/34; B82Y 10/00
See application file for complete search history.

(56) References Cited

U.S. PATENT DOCUMENTS

| | | | |
|---|---|---|---|
| 9,691,774 B2 | 6/2017 | Liaw | |
| 2003/0194872 A1* | 10/2003 | Parikh | H01L 21/76868 257/E21.585 |
| 2004/0115934 A1* | 6/2004 | Broz | H01L 24/03 257/E21.228 |
| 2006/0258160 A1* | 11/2006 | Tabaru | H01L 21/76814 257/E21.252 |

* cited by examiner

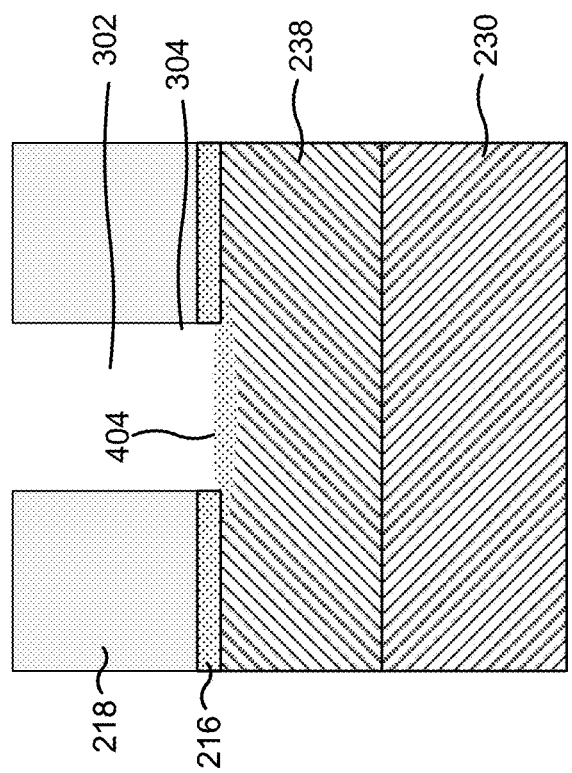

OXIDATION TO MITIGATE DRY ETCH AND/OR WET ETCH FLUORINE RESIDUE

CROSS-REFERENCE TO RELATED APPLICATION

This patent application claims priority to U.S. Provisional Patent Application No. 63/176,032, filed on Apr. 16, 2021, and entitled "OXIDATION TO MITIGATE DRY ETCH RESIDUE." The disclosure of the prior application is considered part of and is incorporated by reference into this patent application.

BACKGROUND

Some electronic devices, such as a processor, a memory device, or another type of electronic device, include a middle end of line (MEOL) region that electrically connects transistors in a front end of line (FEOL) region to a back end of line (BEOL) region. The MEOL region may include a dielectric layer and contact plugs (also referred to as contact vias) formed in the dielectric layer. The contact plugs may electrically connect to source/drain regions and metal gates of the FEOL region. A contact plug may include one or more metals, such as tungsten, cobalt, ruthenium, or copper.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4F are diagrams of an example implementation described herein.

DETAILED DESCRIPTION

Figure 1:
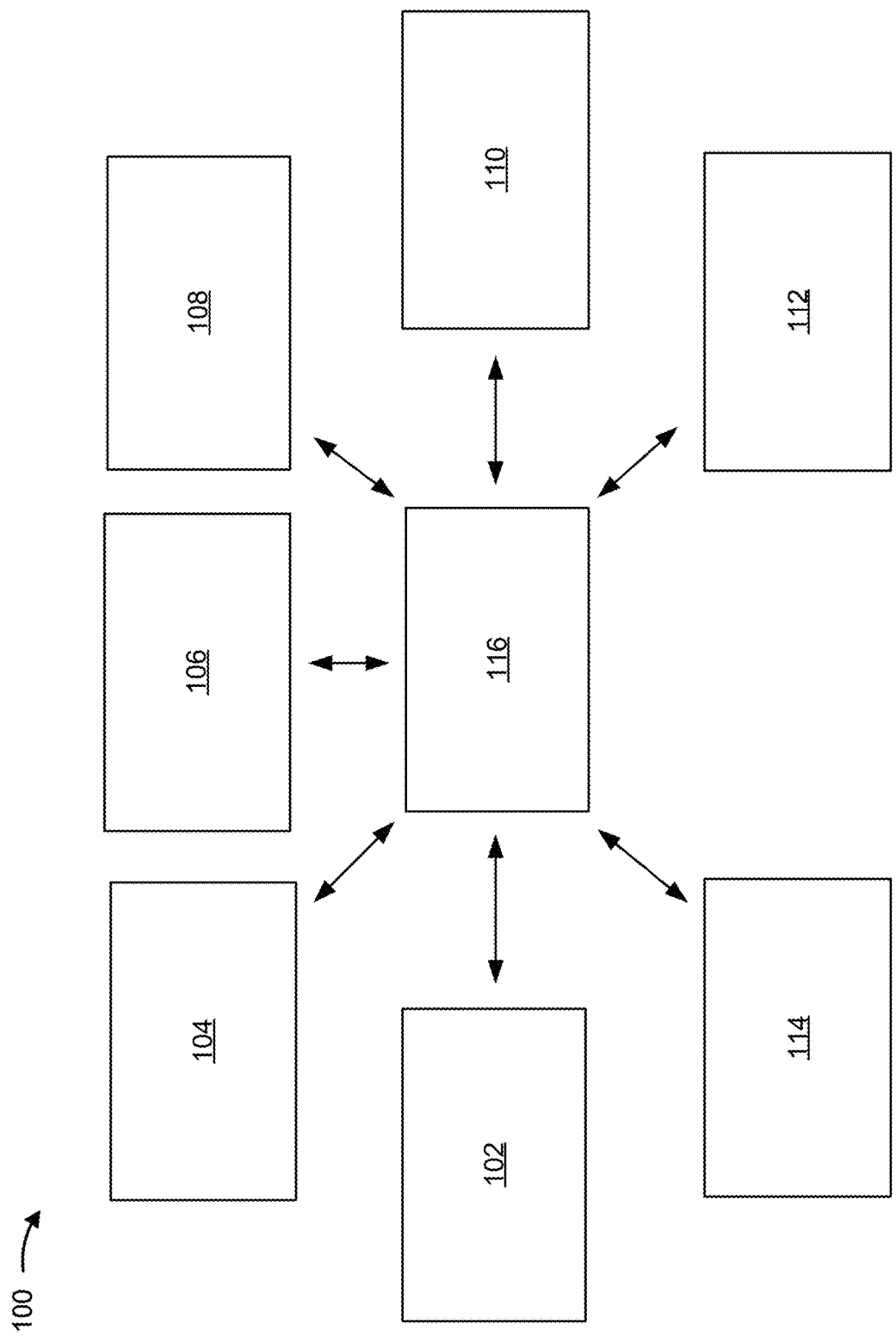
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to form conductive structures for an MEOL region, a source/drain contact of the MEOL region may be etched to form a recess therein. Similarly, a gate contact of the MEOL region may be etched to form a recess therein. By forming the conductive structure within a recess, surface area for the conductive structure is increased, which reduces the electrical resistance between the conductive structure and the source/drain contact (or gate contact). Fluorine (F) is often used to perform dry etching of an oxide layer to form an initial recess or opening, followed by wet etching (e.g., using hydrofluoric acid (HF)) of the source/drain through the initial opening in order to form the recess. However, dry etching uses gaseous fluorine, and wet etching produces gaseous fluorine as a byproduct of the hydrofluoric acid reacting with the metal, and fluorine binds to many metals used for source/drain contacts and gate contacts, such as cobalt (Co). Accordingly, when the recess is cleaned using a solvent (e.g., water, hydrogen peroxide, or another solvent), the cobalt fluoride ($CoF_x$) reacts with the solvent to form hydrofluoric acid. This byproduct causes additional wet etching of the source/drain contact (or gate contact). For example, the recess may have a depth to width ratio between 1.5 and 2.0 on account of the additional wet etching.

When the source/drain contact or the gate contact is etched too far, however, the electrical resistance between the conductive structure and the source/drain contact or the gate contact becomes too small. This can reduce performance of a corresponding channel in the FEOL region by reducing a threshold voltage for a corresponding gate such that the gate turns on more frequently than desired and/or by decreasing a maximum voltage at which the gate is damaged by excessive current. In some situations, the source/drain contact or the gate contact is etched too far such that a layer of silicide (e.g., a titanium silicide (TiSi) layer on a wafer) below the source/drain contact or the gate contact is damaged by the hydrofluoric acid. This results in a significant increase of the electrical resistance between the conductive structure and the source/drain contact or the gate contact, which reduces performance of the channel.

Some implementations described herein provide a source/drain contact having a recess (for a recessed portion) with a depth to width ratio in a range from approximately 1.0 to approximately 1.4. This ratio improves performance of the corresponding channel by providing a large enough threshold voltage for the gate such that the gate turns on when expected and by providing a large enough maximum voltage such that the gate is not damaged during normal operation.

In order to achieve a depth to width ratio in a range from approximately 1.0 to approximately 1.4, some implementations described herein provide a method for forming a recess (for the recessed portion) in which fluorine is oxidized (e.g., using ozone and/or another oxidizing agent) after dry etching and before cleaning (e.g., using water, hydrogen peroxide, or another solvent). Accordingly, less hydrofluoric acid is formed during cleaning, which reduces unexpected wet etching of the source/drain contact. This allows for forming the recess with the depth to width ratio described above. It also prevents damage to the layer of silicide that can be caused by excessive hydrofluoric acid.

Additionally, or alternatively, some implementations described herein provide a method for forming the recess (for the recessed portion) in which the recess is formed using multiple wet etch processes, and any residual fluorine (e.g., in the form of a metal fluoride, such as cobalt fluoride) is oxidized (e.g., using ozone and/or another oxidizing agent) between the wet etch processes. Accordingly, each wet etching process may be shorter in time and less corrosive, which allows for greater control over dimensions of the formed recess. Additionally, less hydrofluoric acid may be formed during cleaning processes between the wet etch processes, which reduces the etching of the source/drain between processes. This also allows for forming the recess with the depth to width ratio described above and prevents damage to the layer of silicide that can be caused by excessive hydrofluoric acid.

FIG. 1 is a diagram of an example environment 100 in which systems and/or methods described herein may be implemented. The example environment 100 includes semiconductor processing tools that can be used to form semiconductor structures and devices, such as a pixel array or a pixel sensor with silicon-fluorine bonds as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid.

The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
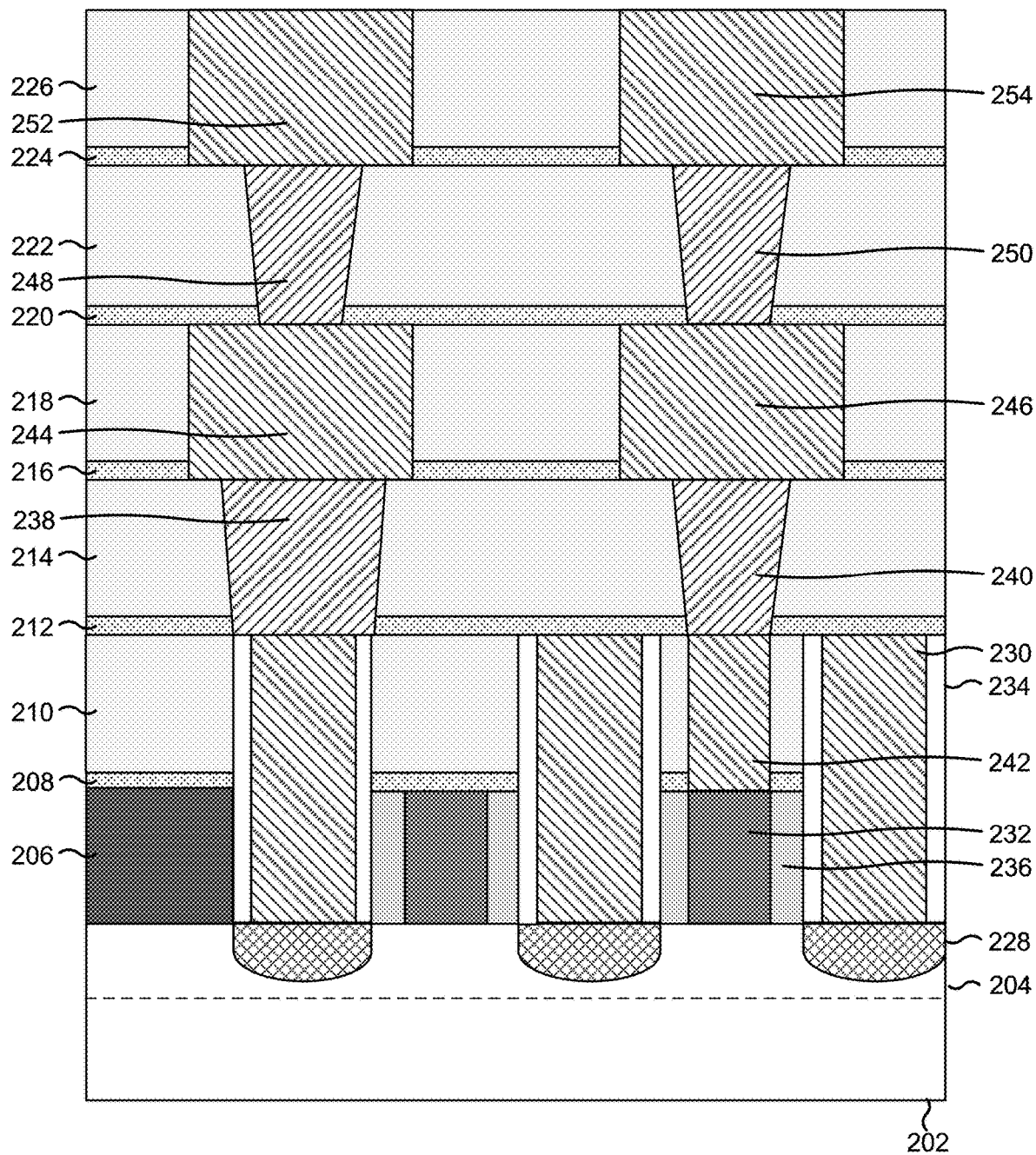
FIG. 2 is a diagram of an example semiconductor structure described herein.

FIG. 2 is a diagram of a portion of an example device 200 described herein. Device 200 includes an example of a memory device (e.g., a static random access memory (SRAM), a dynamic random access memory (DRAM)), a logic device, a processor, an input/output device, or another type of semiconductor device that includes one or more transistors.

The device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride (SiNx), an oxide (e.g., a silicon oxide (SiOx) and/or another oxide material), and/or another type of dielectric material. The ESLs 208, 212, 216, 220, 224 includes a layer of material that is configured to permit various portions of the device 200 (or the layers included therein) to be selectively etched or protected from etching to form one or more of the structures included in the device 200.

As further shown in FIG. 2, the device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source/drain regions of the transistors included in the device 200.

The epitaxial regions 228 are electrically connected to source/drain contacts 230 of the transistors included in the device 200. The metal source/drain contacts (MDs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. In some implementations, the gates 232 may comprise multiple layers of material, such as multiple layers of metal or multiple layers including at least one polysilicon layer and at least one metal layer, among other examples. The source/drain contacts 230 and the gates 232 are electrically isolated by one or more sidewall spacers, including spacers 234 in each side of the source/drain contacts 230 and spacers 236 on each side of the gate 232. The spacers 234 and 236 include a silicon oxide (SiOx), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source/drain contacts 230.

As further shown in FIG. 2, the source/drain contacts 230 and the gates 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

The source/drain contacts 230 are electrically connected to source/drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an MO metallization layer that includes conductive structures 244 and 246. The interconnects 238 and 240 can be a via interconnect. The MO metallization layer is electrically connected to a via layer that includes vias 248 and 250. The via layer is electrically connected to an Ml metallization that includes conductive structures 252 and 254. In some implementations, the BEOL layers of the device 200 includes additional metallization layers and/or vias that connect the device 200 to a package.

As indicated above, FIG. 2 is provided as an example. Other examples may differ from what is described with regard to FIG. 2.

FIGS. 3A-3H are diagrams of an example implementation 300 described herein. Example implementation 300 may be an example process for forming a conductive structure 238. The process includes using oxidation to reduce residual fluorine after dry etching and/or wet etching. The oxidation reduces unexpected wet etching in the source/drain contact 230.

Figure 3A:
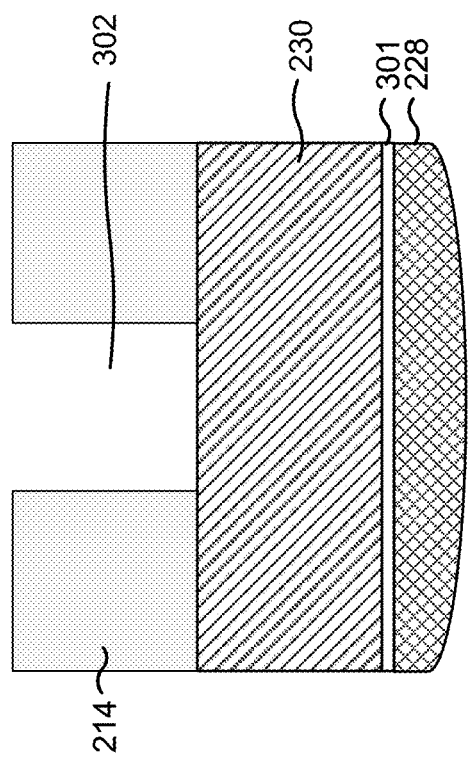
FIGS. 3A-3H are diagrams of an example implementation described herein.

As shown in FIG. 3A, the example process for forming the conductive structure 238 may be performed in connection with an epilayer 228 (S/D of transistor). In some implementations, the deposition tool 102 deposits the epilayer 228 using a CVD technique, a PVD technique, an ALD technique, or another type of deposition technique. In some implementations, the epilayer 228 is formed by epitaxial growth in recessed portions in the fin structure 204. In some implementations, the ion implantation tool 114 dopes the epilayer 228 with $p^+$ ions to increase the p-type dopant concentration. Alternatively, the ion implantation tool 114 dopes the epilayer 228 with $n^+$ ions to increase the n-type dopant concentration. In these examples, the epilayer 228 may be formed with or without in situ doping during the epitaxial growth.

In some implementations, and as shown in FIG. 3A, a layer of silicide 301 is formed on the epilayer 228. The layer of silicide 301 may include titanium silicide (TiSi) and/or another type of silicide material formed by reaction of one or more metals with a silicide material. Using the layer of silicide 301 reduces resistance between the epilayer 228 and the source/drain contact 230.

Additionally, the source/drain contact 230 is formed on the epilayer 228. The deposition tool 102 may deposit the material of the source/drain contact 230 using a CVD technique, a PVD technique, an ALD technique, or another type of deposition technique, the plating tool 112 may deposit the material of the source/drain contact 230 using an electroplating operation, or a combination thereof. In some implementations, the source/drain contact 230 comprise cobalt (Co), tungsten (W), ruthenium (Ru), or another metal. Accordingly, the plating tool 112 may use a sputtering technique (e.g., when the source/drain contact 230 comprises cobalt or ruthenium) and/or a CVD technique (e.g., when the source/drain contact 230 comprises tungsten or ruthenium). In some implementations, the source/drain contact 230 is wider than the epilayer 228. For example, the epilayer 228 may be formed on a fin and/or a nanowire structure, and the source/drain contact 230 may be formed at least as wide as the epilayer 228 such that the source/drain contact 230 contacts a top portion of the epilayer 228. In some implementations, the layer of silicide 301 may be deposited at the interface between the top portion of the epilayer 228 and a bottom portion of the source/drain contact 230 to reduce contact resistance. The planarization tool 110 may planarize the source/drain contact 230 after the source/drain contact 230 is deposited.

As further shown in FIG. 3A, oxide layer 214 (also referred to as "dielectric layer 214") may be formed over the source/drain contact 230. The deposition tool 102 may deposit the oxide layer 214 by a CVD technique, a PVD technique, an ALD technique, or another type of deposition technique. The planarization tool 110 may planarize the oxide layer 214 after the oxide layer 214 is deposited.

The oxide layer 214 may be etched to form an opening (resulting in recess 302) such that the source/drain contact 230 is at least partially exposed. For example, the deposition tool 102 may form a photoresist layer on the oxide layer 214 (or on an ESL formed on the oxide layer 214, such as ESL 216), the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 214 to form the recess 302.

In some implementations, the etch tool 108 performs dry etching using a plasma, such as a fluorine (F) plasma. For example, the etch tool 108 may use a fluorine concentration in a range from approximately 10 standard cubic centimeters per minute (sccm) to approximately 80 sccm. By selecting at least 10 sccm of fluorine, the etch tool 108 may provide that the recess 302 is etched to a sufficient depth and/or width (e.g., as described below in connection with FIG. 3F). Etching the recess 302 to a sufficient depth reduces contact resistance between the source/drain contact 230 and the conductive structure 238, which improves performance of a corresponding gate (e.g., gate 232). By selecting no more than 80 sccm of fluorine, the etch tool 108 may provide that the recess 302 is not etched too deep and/or too wide (e.g., as described below in connection with FIG. 3F). If the recess 302 were too deep or wide, the conductive structure 238 may have a low contact resistance that causes an electrical short between the source/drain and the conductive structure 238.

In some implementations, the etch tool 108 may perform dry etching for an amount of time in a range from approximately 20 minutes to approximately 60 minutes. By selecting at least 20 minutes, the etch tool 108 may provide that the recess 302 is etched to a sufficient depth and/or width (e.g., as described below in connection with FIG. 3F). As described above, etching the recess 302 to a sufficient depth reduces contact resistance between the source/drain contact 230 and the conducive structure 238. By selecting no more than 60 minutes, the etch tool 108 may provide that the recess 302 is not etched too deep and/or too wide (e.g., as described below in connection with FIG. 3F). As described above, if the recess 302 were too deep or wide, the conductive structure 238 may have a low contact resistance that causes an electrical short.

In some implementations, a photoresist removal tool removes the remaining portions of the photoresist layer (e.g., using a chemical stripper, a plasma asher, and/or another technique) after the etch tool 108 etches the recess 302. Although described herein with respect to forming the recess 302 in the oxide layer 214 above source/drain contact 230, the description similarly applies to forming the recess 302 in the oxide layer 214 above gate contact 242. For example, dielectric 206 may be etched to form gate 232, and the dielectric 210 may be etched to form the gate contact 242 above the gate 232. In some implementations, the deposition tool 102 may form a photoresist layer on the dielectric 206, the exposure tool 104 may expose the photoresist layer to a radiation source to pattern the photoresist layer, the developer tool 106 may develop and remove portions of the photoresist layer to expose the pattern, and the etch tool 108 may etch portions of the dielectric 206 to form the gate 232. In some implementations, a photoresist removal tool removes the remaining portions of the photoresist layer (e.g., using a chemical stripper, a plasma asher, and/or another technique) after the etch tool 108 etches the dielectric 206. Similarly, the deposition tool 102 may form a photoresist layer on the dielectric 210, the exposure tool 104 may expose the photoresist layer to a radiation source to pattern the photoresist layer, the developer tool 106 may develop and remove portions of the photoresist layer to expose the pattern, and the etch tool 108 may etch portions of the dielectric 210 to form the gate contact 242. In some implementations, a photoresist removal tool removes the remaining portions of the photoresist layer (e.g., using a chemical stripper, a plasma asher, and/or another technique) after the etch tool 108 etches the dielectric 210.

The dry etching process results in fluorine residue in the recess 302. For example, some of the plasma and gaseous fluorine from the dry etching process binds to metal comprising the source/drain contact 230 to form metal fluorides. Accordingly, a layer of metal fluoride having the chemical form $M_xF_y$ is formed, where M is a metal, such as Co, W, or Ru.

Figure 3B:
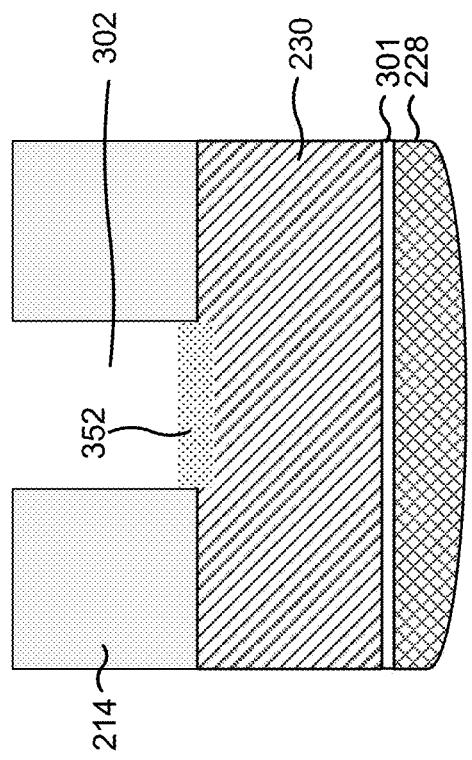

Accordingly, as shown in FIG. 3B, the recess 302 may undergo an oxidation process in order to remove the fluorine residue from the recess 302. In some implementations, an oxidation tool provides an oxidizing agent in order to reduce the fluorine residue (e.g., by causing formation of oxygen fluorides that evaporate) and form a thin layer of byproduct 352. For example, byproduct 352 may include cobalt oxide ($Co(OH)_2$), ruthenium oxide ($RuO_2$ or $RuO_4$), tungsten oxide (such as tungsten (III) oxide, tungsten (IV) oxide, tungsten (VI) oxide, or tungsten pentoxide), and/or another oxide. For example, the oxidation tool may use ozone, an ammonia and hydrogen peroxide mixture, an ammonia and ozone mixture, and/or an organic oxidizing agent. In some implementations, the oxidizing agent is used in a concentration in a range from approximately 5% to approximately 60%. By selecting a concentration of at least 5% (by volume), the oxidation tool triggers reduction of the fluorine residue because a lower concentration may fail to cause a desired amount of reduction. By selecting a concentration of no more than 60% (by volume), the oxidation tool prevents unwanted reduction of chemicals in the oxide layer 214 or the source/drain contact 230 other than the byproduct 352. Additionally, selecting a concentration of no more than 60% reduces waste of the oxidizing agent whose efficacy may decrease after 60%.

In some implementations, the oxidation process is performed for an amount of time in a range from approximately 1 minute to approximately 5 minutes. By selecting at least 1 minute, the oxidation tool triggers reduction of the fluorine residue by approximately 70%. By selecting no more than 5 minutes, the oxidation tool conserves power and oxidizing agent because further oxidation will not trigger significant additional reduction of the fluorine residue (e.g., reduction of less than 30% after 5 minutes). Performing oxidation for a time less than 1 minute while still reducing a sufficient quantity of fluorine residue may be realized with additional miniaturization of semiconductor devices.

The byproduct 352 may be removed using a cleaning process. For example, a cleaning tool may use water ($H_2O$), hydrogen peroxide ($H_2O_2$), and/or another solvent in order to remove the byproduct 352 from the recess 302. In some implementations, the cleaning process is performed for an amount of time in a range from approximately 5 minutes to approximately 10 minutes. By selecting at least 5 minutes, the cleaning tool removes most of the byproduct 352. By selecting no more than 10 minutes, the cleaning tool conserves power and solvent because further cleaning will not remove significant additional amounts of the byproduct 352. Performing cleaning for a time less than 5 minutes while still removing a sufficient quantity of the byproduct 352 may be realized with additional miniaturization of semiconductor devices.

During the cleaning process, less fluorine residue remains in the recess 302 because of the oxidation process. For example, the oxidation process causes reduction of the metal fluorides in the recess 302 to produce oxygen fluorides and gaseous fluorine that evaporate and leave metal in the recess 302. The fluorine residue reacts with the solvent used during the cleaning process to form hydrofluoric acid (e.g., the metal fluorides in the recess 302 react with water or hydrogen peroxide to produce gaseous oxygen and fluorine as well as hydrofluoric acid), which causes unexpected wet etching of the source/drain contact 230. Accordingly, the oxidation process reduces (or eliminates) unexpected wet etching of the source/drain contact 230.

Figure 3C:
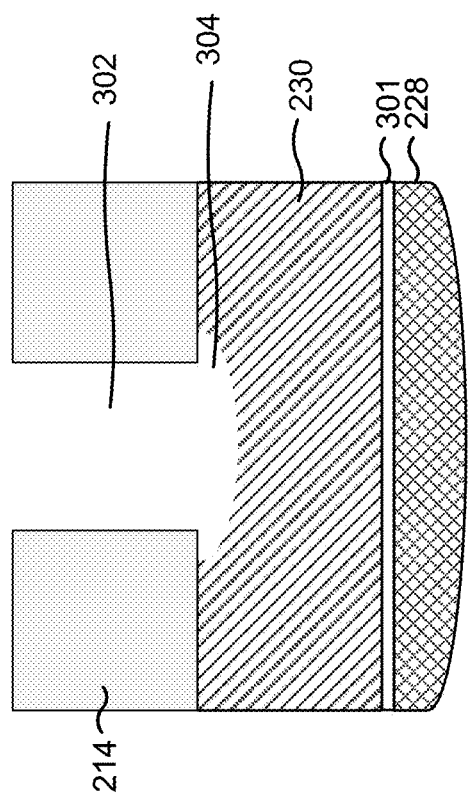

As shown in FIG. 3C, the etch tool 108 performs wet etching of the source/drain contact 230 using an etchant, such as hydrofluoric acid, to form recess 304. For example, the etch tool 108 may provide the etchant through the recess 302. In some implementations, the etch tool 108 performs wet etching for an amount of time in a range from approximately 5 minutes to approximately 15 minutes. By selecting at least 5 minutes, the etch tool 108 may provide that the recess 304 is etched with a non-insignificant depth and width. Etching the recess 304 to a sufficient depth reduces contact resistance between the source/drain contact 230 and the conductive structure 238. By selecting no more than 15 minutes, the etch tool 108 may provide that the recess 304 is not etched too deep. If the recess 304 were too deep, recess 304 may be etched through the source/drain contact 230 such that the layer of silicide 301 is damaged by the etchant. As a result, current goes directly from the conductive structure 238 to the epilayer 228, which increases contact resistance at the source/drain.

The wet etching process results in fluorine residue in the recess 304. For example, some of the fluorine, from the hydrofluoric acid used in the wet etching process, binds to metal comprising the source/drain contact 230 to form metal fluorides, rather than evaporating as gaseous fluorine. Accordingly, a layer of metal fluoride having the chemical form $M_xF_y$ is formed, where M is a metal, such as Co, W, or Ru.

In some implementations, the cleaning process described in connection with FIG. 3B is omitted. For example, the etchant used for wet etching may be dissolved in a solution of water ($H_2O$), hydrogen peroxide ($H_2O_2$), and/or another solvent such that the wet etching process both removes the byproduct 352 and forms recess 304.

Figure 3D:
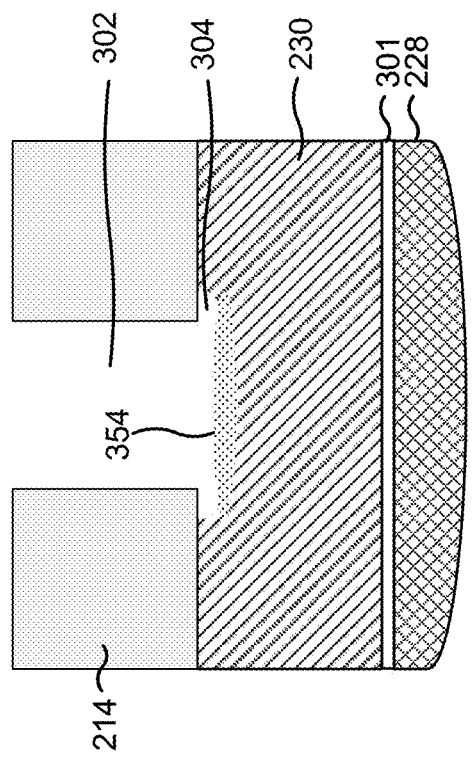

Accordingly, as shown in FIG. 3D, the recess 304 may undergo an oxidation process in order to remove the fluorine residue from the recess 304. In some implementations, an oxidation tool provides an oxidizing agent in order to reduce the fluorine residue (e.g., by causing formation of oxygen fluorides that evaporate) and form a thin layer of byproduct 354. For example, byproduct 354 may include cobalt oxide ($Co(OH)_2$), ruthenium oxide ($RuO_2$ or $RuO_4$), tungsten oxide (such as tungsten (III) oxide, tungsten (IV) oxide, tungsten (VI) oxide, or tungsten pentoxide), and/or another oxide. For example, the oxidation tool may use ozone, an ammonia and hydrogen peroxide mixture, an ammonia and ozone mixture, and/or an organic oxidizing agent. In some implementations, the oxidizing agent is used in a concentration in a range from approximately 5% to approximately 60%. By selecting a concentration of at least 5% (by volume), the oxidation tool triggers reduction of the fluorine residue because a lower concentration may fail to cause reduction. By selecting a concentration no more than 60% (by volume), the oxidation tool prevents unwanted reduction of chemicals in the oxide layer 214 or the source/drain 230 other than the byproduct 354. Additionally, selecting a concentration no more than 60% reduces waste of the oxidizing agent whose efficacy may decrease after 60%.

In some implementations, the oxidation process is performed for an amount of time in a range from approximately 1 minute to approximately 5 minutes. By selecting at least 1 minute, the oxidation tool triggers reduction of the fluorine residue by approximately 70%. By selecting no more than 5 minutes, the oxidation tool conserves power and oxidizing agent because further oxidation will not trigger significant additional reduction of the fluorine residue (e.g., reduction of less than 30% after 5 minutes).

In some implementations, the byproduct 354 is removed using a cleaning process. For example, a cleaning tool may use water ($H_2O$), hydrogen peroxide ($H_2O_2$), and/or another solvent in order to remove the byproduct 354 from the recess 304. In some implementations, the cleaning process is performed for an amount of time in a range from approximately 5 minutes to approximately 10 minutes. By selecting at least 5 minutes, the cleaning tool removes most of the byproduct 354. By selecting no more than 10 minutes, the cleaning tool conserves power and solvent because further cleaning will not remove significant additional amounts of the byproduct 354.

Dry etching is effective at removing dielectric material, such as the oxide layer 214, while wet etching is more effective at removing metal, such as the source/drain contact 230. Additionally, using dry etching for the oxide layer 214 results in less damage to nearby materials, as compared with wet etching, because the plasma is directional. On the other hand, using wet etching for the source/drain contact 230 allows for formation of the recess 304 wider than the recess 302 because hydrofluoric acid flows under the oxide layer 214 while fluorine plasma does not.

During the cleaning process, less fluorine residue remains in the recess 304 because of the oxidation process. For example, the oxidation process causes reduction of the metal fluorides in the recess 304 to produce oxygen fluorides and gaseous fluorine that evaporate and leave metal in the recess 304. The fluorine residue reacts with the solvent used during the cleaning process to form hydrofluoric acid (e.g., the metal fluorides in the recess 304 react with water or hydrogen peroxide to produce gaseous oxygen and fluorine as well as hydrofluoric acid), which causes unexpected wet etching of the source/drain contact 230. Accordingly, the oxidation process reduces (or eliminates) unexpected wet etching of the source/drain contact 230.

Figure 3E:
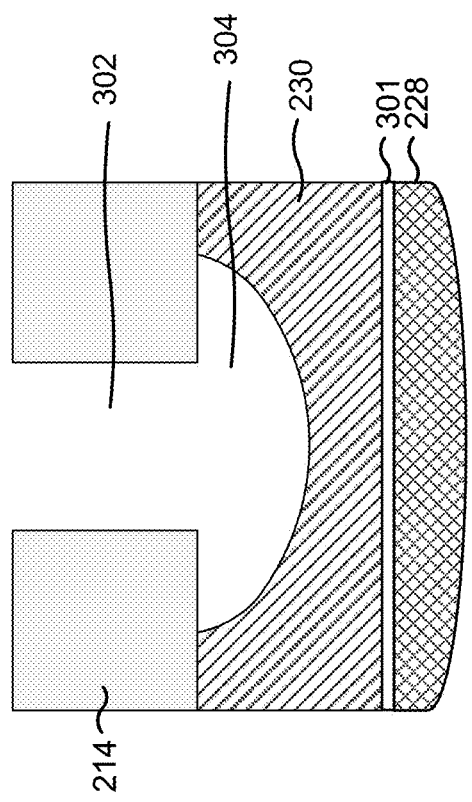

As shown in FIG. 3E, the etch tool 108 may perform one or more additional wet etch processes to increase the width and/or the depth of the recess 304. The oxidation tool may also perform an additional oxidation process after each additional wet etch process. Accordingly, during each wet etch process, less fluorine residue remains in the recess 304, from a previous wet etch process, because of an intervening oxidation process. The fluorine residue reacts with the solvent used during the cleaning process to form hydrofluoric acid, which causes unexpected wet etching of the source/drain contact 230. Accordingly, each additional oxidation process reduces unexpected wet etching of the source/drain contact 230 at a subsequent wet etch process. Additionally, in some implementations, the cleaning tool may perform a cleaning process after each additional oxidation process. During each cleaning process, less fluorine residue remains in the recess 304 because of a previous oxidation process. The fluorine residue reacts with the solvent used during the cleaning process to form hydrofluoric acid, which causes unexpected wet etching of the source/drain contact 230. Accordingly, each additional oxidation process reduces unexpected wet etching of the source/drain contact 230 at a subsequent cleaning process.

In some implementations, the cleaning process described in connection with FIG. 3D is omitted. For example, the etchant used for wet etching may be dissolved in a solution of water ($H_2O$), hydrogen peroxide ($H_2O_2$), and/or another solvent such that the wet etching process both removes the byproduct 354 and increases the width and/or the depth of the recess 304.

In some implementations, the recess 304 may be formed using up to 15 cycles that include a wet etch process followed by an oxidation process (and optionally a cleaning process). By selecting more than 1 cycle, the recess 304 may be formed with a sufficient depth and/or width (e.g., as described below in connection with FIG. 3F). Etching the recess 304 to a sufficient depth reduces contact resistance between the source/drain contact 230 and the conductive structure 238. By selecting no more than 15 cycles, the recess 304 is not etched too deep and/or too wide (e.g., as described below in connection with FIG. 3F). If the recess 304 were too deep or wide, the conductive structure 238 may have a low contact resistance that causes an electrical short.

Although described herein with respect to forming the recess 304 in the source/drain contact 230 above the epilayer 228, the description similarly applies to forming the recess 304 in the gate contact 242 above the gate 232.

Figure 3F:
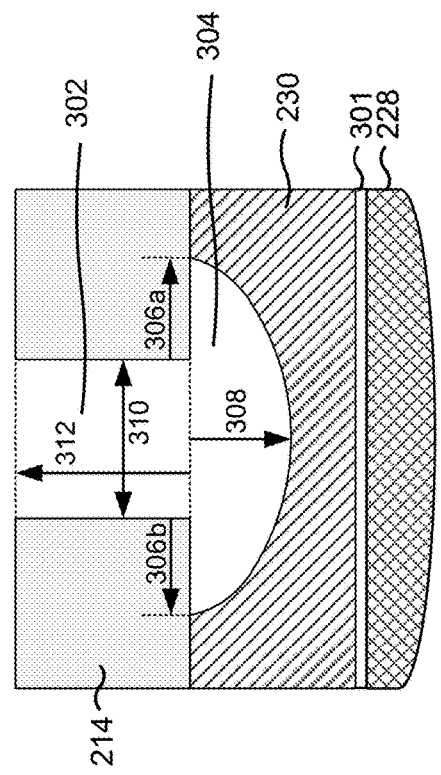

As shown in FIG. 3F, the recess 304 may be formed with a width and a depth 308. Because the recess 304 is undercut, as shown in FIG. 3F, the width 306a and 306b may be measured excluding the width 310 of the recess 302. In some implementations, a ratio of the depth 308 to the width 306a and 306b is in a range from approximately 1.0 to approximately 1.4. For example, the width 306a and 306b may be in a range from approximately 4 nanometers (nm) to approximately 8 nm, and the depth 308 may be in a range from approximately 6 nm to approximately 9 nm. By selecting the ratio to be at least 1.0, surface area between the conductive structure 238 and the source/drain contact 230 is increased, which reduces contact resistance at an interface between the conductive structure 238 and the source/drain contact 230. By selecting the ratio to be no more than 1.4, the depth 308 of the recess 304 is kept sufficiently shallow to prevent damage to the layer of silicide 301 from the etchant used during wet etching of the recess 304. Accordingly, the layer of silicide 301 may be substantially (e.g., less than 5% of a surface area associated with the layer of silicide 301) undamaged by acid from the wet etching. Additionally, the depth 308 of the recess 304 is sufficiently shallow to prevent an electrical short at the conductive structure 238.

Additionally, or alternatively, in some implementations, a ratio of the width 306a and 306b to a width of the source/drain contact 230 is in a range from approximately 0.02 to approximately 0.3. Similarly, in some implementations, a ratio of the depth 308 to a depth of the source/drain contact 230 is in a range from approximately 0.2 to approximately 0.5. By selecting these ratios to be at least 0.02 and 0.2, respectively, the surface area between the conductive structure 238 and the source/drain contact 230 is increased, which reduces contact resistance at an interface between the conductive structure 238 and the source/drain contact 230. By selecting the ratios to be no more than 0.3 and 0.5, respectively, the depth 308 of the recess 304 is kept sufficiently shallow to prevent damage to the layer of silicide 301 and to prevent an electrical short at the conductive structure 238.

As further shown in FIG. 3F, the recess 302 may be formed with a width 310 and a depth 312 (e.g., using dry etching as described above). In some implementations, a ratio of the width 310 to the depth 312 is in a range from approximately 1.0 to approximately 1.6. For example, the width 310 may be in a range from approximately 10 nm to approximately 80 nm, and the depth 312 may be in a range from approximately 10 nm to approximately 50 nm. By selecting the ratio to be at least 1.0, the conductive structure 238 is formed with a sufficient volume to conduct current to and from the source/drain contact 230. By selecting the ratio to be no more than 1.6, the conductive structure 238 is formed with sufficient resistance to prevent an electrical short at the conductive structure 238.

Additionally, or alternatively, in some implementations, the depth 308 of the recess 304 is in a range from approximately 0.25 times to approximately 0.75 times the width 310 of the recess 302. For example, when the width 310 is in a range from approximately 6 nm to approximately 9 nm, a difference between the depth 308 and the width 310 is in a range from approximately −6 nm to approximately −9 nm. By selecting the depth 308 to be at least 0.25 times the width 310, contact area between the conductive structure 238 and the source/drain contact 230 is increased, which reduces contact resistance at an interface between the conductive structure 238 and the source/drain contact 230. By selecting the depth 308 to be no more than 0.75 times the width 310, the conductive structure 238 is formed with sufficient resistance to prevent an electrical short at the conductive structure 238.

Figure 3G:
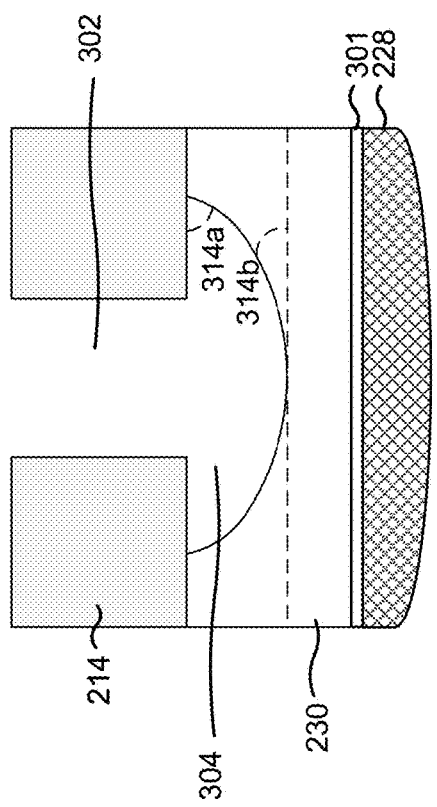

As shown in FIG. 3G, the recess 304 may be formed such that a top portion of the recess 304 is associated with a first curve angle 314a relative to an axis that is parallel with a bottom surface of the oxide layer 214, and a bottom portion of the recess 304 is associated with a second curve angle 314b relative to the axis. In some implementations, a difference between the first curve angle 314a and the second curve angle 314b is within a range from approximately 10 degrees to approximately 30 degrees. By selecting the difference to be at least 10 degrees, the layer of silicide 301 may be substantially undamaged by acid from the wet etching. Additionally, the depth 308 of the recess 304 is sufficiently shallow to prevent an electrical short at the conductive structure 238. By selecting the difference to be no more than 30 degrees, contact area between the conductive structure 238 and the source/drain contact 230 is increased, which reduces contact resistance at an interface between the conductive structure 238 and the source/drain contact 230.

Figure 3H:
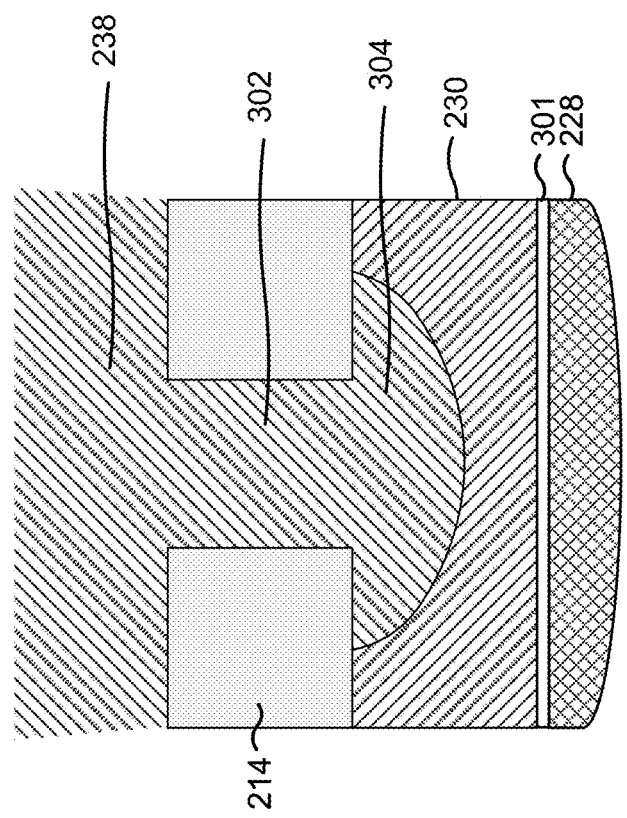

The conductive structure 238 may be formed in a recessed portion that includes the recess 302 and the recess 304, as shown in FIG. 3H. The conductive structure 238 may comprise a contact plug, a contact via, and/or another conductive structure. Accordingly, the conductive structure may be wider or less wide than the contact 230. The deposition tool 102 may deposit the material of the conductive structure 238 using a CVD technique, a PVD technique, an ALD technique, or another type of deposition technique, the plating tool 112 may deposit the material of the conductive structure 238 using an electroplating operation, or a combination thereof. The planarization tool 110 may planarize the conductive structure 238 after the conductive structure 238 is deposited. In some implementations, the conductive structure 328 is additionally deposited to extend beyond a top surface of the oxide layer 214.

As indicated above, FIGS. 3A-3H are provided as one or more examples. Other examples may differ from what is described with regard to FIGS. 3A-3H.

FIGS. 4A-4F are diagrams of an example implementation 400 described herein. Example implementation 400 may be an example process for forming a conductive structure 244. The process includes using oxidation to reduce residual fluorine after dry etching and/or wet etching. The oxidation reduces unexpected wet etching in conductive structure 238.

In some implementations, the conductive structure 238 is formed on source/drain contact 230 as described above in connection with FIGS. 3A-3H. As further shown in FIG. 4A, ESL 216 and oxide layer 218 (also referred to as "dielectric layer 218") may be formed over the conductive structure 238. The deposition tool 102 may deposit the ESL 216 and the oxide layer 218 by a CVD technique, a PVD technique, an ALD technique, or another type of deposition technique. The planarization tool 110 may planarize the ESL 216 and the oxide layer 218 after the ESL 216 and the oxide layer 218 are deposited, respectively.

The oxide layer 218 may be etched to form an opening (resulting in recess 302) such that the conductive structure 238 is at least partially exposed. For example, the deposition tool 102 may form a photoresist layer on the oxide layer 218 (or on an ESL formed on the oxide layer 218, such as ESL 220), the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 218 to form the recess 302.

In some implementations, the etch tool 108 performs dry etching using a plasma, such as a fluorine (F) plasma. For example, the etch tool 108 may use a fluorine concentration in a range from approximately 10 sccm to approximately 80 sccm. By selecting at least 10 sccm of fluorine, the etch tool 108 may provide that the recess 302 is etched to a sufficient depth and/or width (e.g., as described above in connection with FIG. 3F). Etching the recess 302 to a sufficient depth reduces contact resistance between the conductive structure 238 and the conductive structure 244. By selecting no more than 80 sccm of fluorine, the etch tool 108 may provide that the recess 302 is not etched too deep and/or too wide (e.g., as described above in connection with FIG. 3F). If the recess 302 were too deep or wide, the conductive structure 244 may have a low contact resistance that causes an electrical short.

In some implementations, the etch tool 108 may perform dry etching for an amount of time in a range from approximately 20 minutes to approximately 60 minutes. By selecting at least 20 minutes, the etch tool 108 may provide that the recess 302 is etched to a sufficient depth and/or width (e.g., as described above in connection with FIG. 3F). As described above, etching the recess 302 to a sufficient depth reduces contact resistance between the conductive structure 238 and the conductive structure 244. By selecting no more than 60 minutes, the etch tool 108 may provide that the recess 302 is not etched too deep and/or too wide (e.g., as described above in connection with FIG. 3F). As described above, if the recess 302 were too deep or wide, the conductive structure 244 may have a low contact resistance that causes an electrical short.

In some implementations, a photoresist removal tool removes the remaining portions of the photoresist layer (e.g., using a chemical stripper, a plasma asher, and/or another technique) after the etch tool 108 etches the recess 302. Although described herein with respect to forming the recess 302 in the oxide layer 218 above conductive structure 238, the description similarly applies to forming the recess 302 in the oxide layer 222 above conductive structure 244. For example, conductive structure 244 may be formed as described herein, and conductive structure 248 may be similarly formed above the conductive structure 244.

Figure 4A:
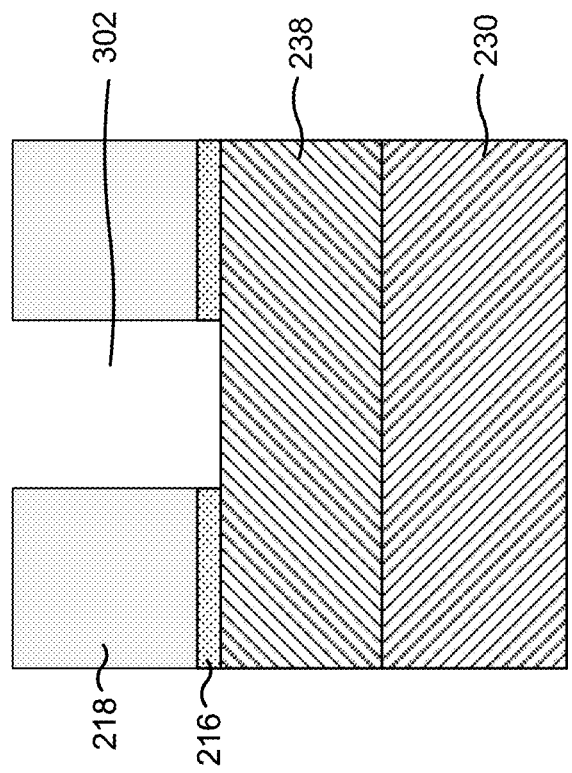
Figure 4B:
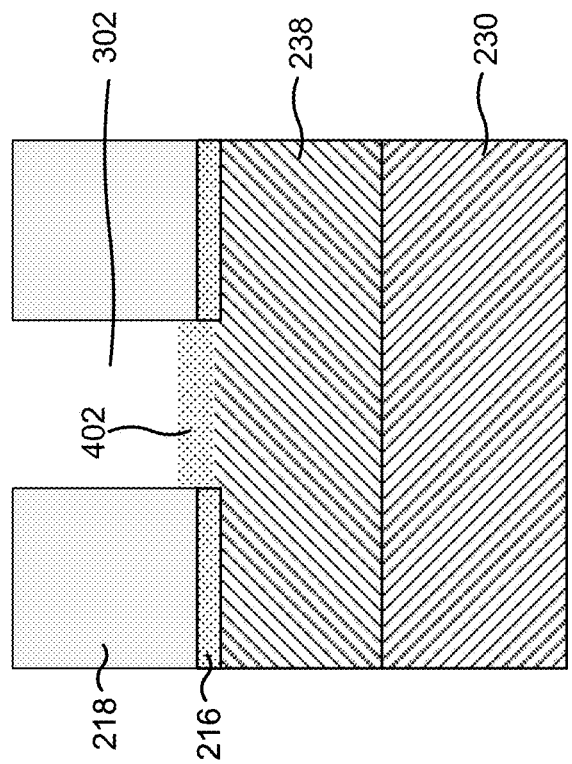

The dry etching process results in fluorine residue in the recess 302. Accordingly, as shown in FIG. 4B, the recess 302 may undergo an oxidation process in order to remove the fluorine residue from the recess 302. In some implementations, an oxidation tool provides an oxidizing agent in order to reduce the fluorine residue and form a thin layer of byproduct 402. For example, byproduct 402 may include cobalt oxide ($Co(OH)_2$), ruthenium oxide ($RuO_2$ or $RuO_4$), tungsten oxide (such as tungsten (III) oxide, tungsten (IV) oxide, tungsten (VI) oxide, or tungsten pentoxide), and/or another oxide. For example, the oxidation tool may use ozone, an ammonia and hydrogen peroxide mixture, an ammonia and ozone mixture, and/or an organic oxidizing agent. In some implementations, the oxidizing agent is used in a concentration in a range from approximately 5% to approximately 60%. By selecting a concentration of at least 5% (by volume), the oxidation tool triggers reduction of the fluorine residue because a lower concentration may fail to cause reduction. By selecting a concentration no more than 60% (by volume), the oxidation tool prevents unwanted reduction of chemicals in the oxide layer 218 or the contact plug 238 other than the byproduct 402. Additionally, selecting a concentration no more than 60% reduces waste of the oxidizing agent whose efficacy may decrease after 60%.

In some implementations, the oxidation process is performed for an amount of time in a range from approximately 1 minute to approximately 5 minutes. By selecting at least 1 minute, the oxidation tool triggers reduction of the fluorine residue by approximately 70%. By selecting no more than 5 minutes, the oxidation tool conserves power and oxidizing agent because further oxidation will not trigger significant additional reduction of the fluorine residue (e.g., reduction of less than 30% after 5 minutes).

The byproduct 402 may be removed using a cleaning process. For example, a cleaning tool may use water ($H_2O$), hydrogen peroxide ($H_2O_2$), and/or another solvent in order to remove the byproduct 402 from the recess 302. In some implementations, the cleaning process is performed for an amount of time in a range from approximately 5 minutes to approximately 10 minutes. By selecting at least 5 minutes, the cleaning tool removes most of the byproduct 402. By selecting no more than 10 minutes, the cleaning tool conserves power and solvent because further cleaning will not remove significant additional amounts of the byproduct 402.

During the cleaning process, less fluorine residue remains in the recess 302 because of the oxidation process. The fluorine residue reacts with the solvent used during the cleaning process to form hydrofluoric acid, which causes unexpected wet etching of the conductive structure 238. Accordingly, the oxidation process reduces unexpected wet etching of the conductive structure 238.

Figure 4C:
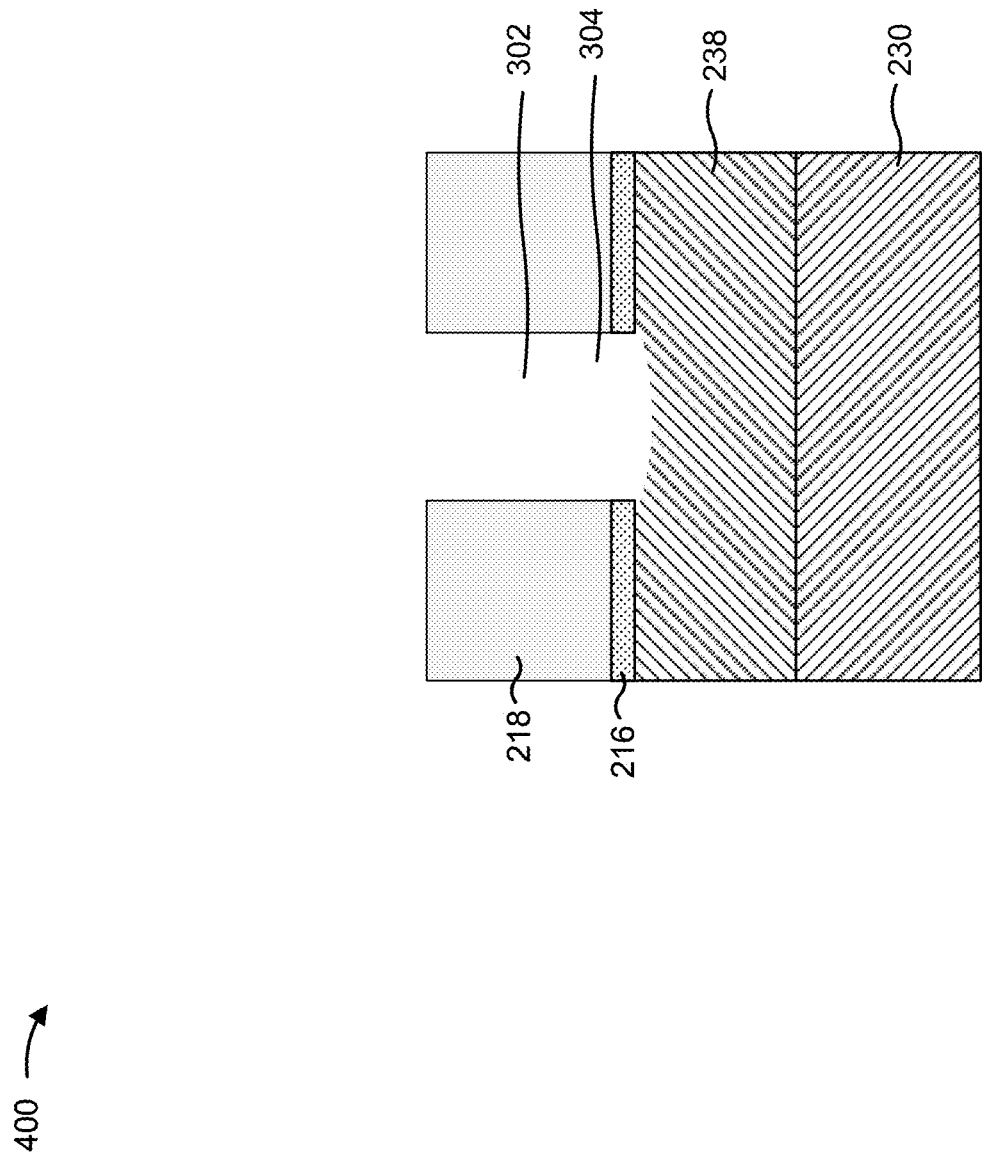

As shown in FIG. 4C, the etch tool 108 performs wet etching of the conductive structure 238 using an etchant, such as hydrofluoric acid. For example, the etch tool 108 may provide the etchant through the recess 302. In some implementations, the etch tool 108 performs wet etching for an amount of time in a range from approximately 5 minutes to approximately 15 minutes. By selecting at least 5 minutes, the etch tool 108 may provide that the recess 304 is etched with a non-insignificant depth and width. Etching the recess 304 to a sufficient depth reduces contact resistance between the conductive structure 238 and the conductive structure 244. By selecting no more than 15 minutes, the etch tool 108 may provide that the recess 304 is not etched too deep. If the recess 304 were too deep, the source/drain contact 230 may be damaged by the etchant, which may cause an electrical short.

In some implementations, the cleaning process described in connection with FIG. 4B is omitted. For example, the etchant used for wet etching may be dissolved in a solution of water ($H_2O$), hydrogen peroxide ($H_2O_2$), and/or another solvent such that the wet etching process both removes the byproduct 402 and forms the recess 304.

The wet etching process results in fluorine residue in the recess 304. Accordingly, as shown in FIG. 4D, the recess 304 may undergo an oxidation process in order to remove the fluorine residue from the recess 304. In some implementations, an oxidation tool provides an oxidizing agent in order to reduce the fluorine residue and form a thin layer of byproduct 404. For example, byproduct 404 may include cobalt oxide ($Co(OH)_2$), ruthenium oxide ($RuO_2$ or $RuO_4$), tungsten oxide (such as tungsten (III) oxide, tungsten (IV) oxide, tungsten (VI) oxide, or tungsten pentoxide), and/or another oxide. For example, the oxidation tool may use ozone, an ammonia and hydrogen peroxide mixture, an ammonia and ozone mixture, and/or an organic oxidizing agent. In some implementations, the oxidizing agent is used in a concentration in a range from approximately 5% to approximately 60%. By selecting a concentration of at least 5% (by volume), the oxidation tool triggers reduction of the fluorine residue because a lower concentration may fail to cause reduction. By selecting a concentration no more than 60% (by volume), the oxidation tool prevents unwanted reduction of chemicals in the oxide layer 218 or the conductive structure 238 other than the byproduct 404. Additionally, selecting a concentration no more than 60% reduces waste of the oxidizing agent whose efficacy may decrease after 60%.

In some implementations, the oxidation process is performed for an amount of time in a range from approximately 1 minute to approximately 5 minutes. By selecting at least 1 minute, the oxidation tool triggers reduction of the fluorine residue by approximately 70%. By selecting no more than 5 minutes, the oxidation tool conserves power and oxidizing agent because further oxidation will not trigger significant additional reduction of the fluorine residue (e.g., reduction of less than 30% after 5 minutes).

In some implementations, the byproduct 404 is removed using a cleaning process. For example, a cleaning tool may use water ($H_2O$), hydrogen peroxide ($H_2O_2$), and/or another solvent in order to remove the byproduct 404 from the recess 304. In some implementations, the cleaning process is performed for an amount of time in a range from approximately 5 minutes to approximately 10 minutes. By selecting at least 5 minutes, the cleaning tool removes most of the byproduct 404. By selecting no more than 10 minutes, the cleaning tool conserves power and solvent because further cleaning will not remove significant additional amounts of the byproduct 404.

During the cleaning process, less fluorine residue remains in the recess 304 because of the oxidation process. The fluorine residue reacts with the solvent used during the cleaning process to form hydrofluoric acid, which causes unexpected wet etching of the contact plug 238. Accordingly, the oxidation process reduces unexpected wet etching of the contact plug 238.

Figure 4E:
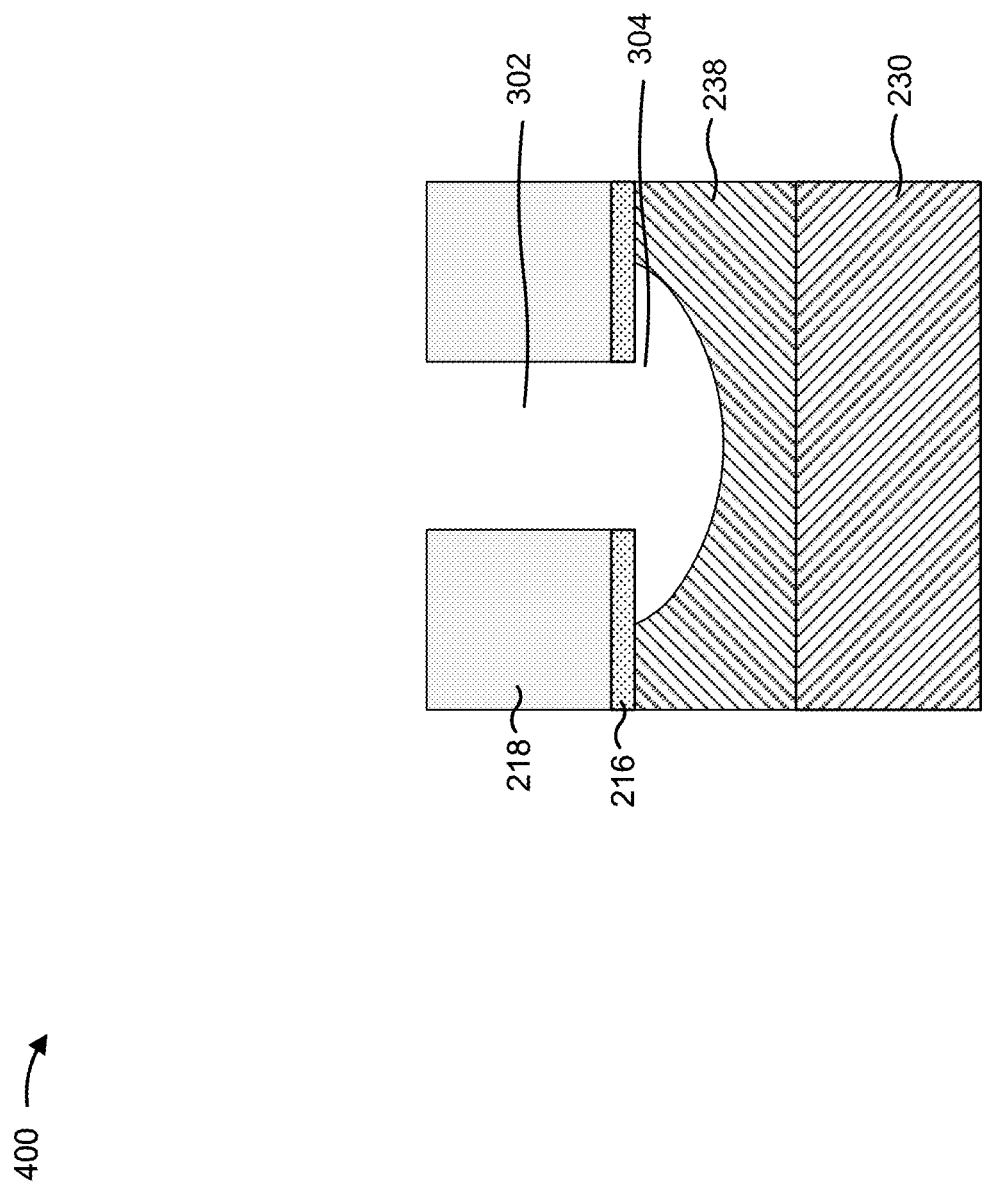

As shown in FIG. 4E, the etch tool 108 may perform one or more additional wet etch processes to increase the width and/or the depth of the recess 304. The oxidation tool may also perform an additional oxidation process after each additional wet etch process. Accordingly, during each wet etch process, less fluorine residue remains in the recess 304, from a previous wet etch process, because of an intervening oxidation process. The fluorine residue reacts with the solvent used during the cleaning process to form hydrofluoric acid, which causes unexpected wet etching of the conductive structure 238. Accordingly, each additional oxidation process reduces unexpected wet etching of the conductive structure 238 at a subsequent wet etch process. Additionally, in some implementations, the cleaning tool may perform a cleaning process after each additional oxidation process. During each cleaning process, less fluorine residue remains in the recess 304 because of a previous oxidation process. The fluorine residue reacts with the solvent used during the cleaning process to form hydrofluoric acid, which causes unexpected wet etching of the conductive structure 238. Accordingly, each additional oxidation process reduces unexpected wet etching of the conductive structure 238 at a subsequent cleaning process.

In some implementations, the cleaning process described in connection with FIG. 4D is omitted. For example, the etchant used for wet etching may be dissolved in a solution of water ($H_2O$), hydrogen peroxide ($H_2O_2$), and/or another solvent such that the wet etching process both removes the byproduct 404 and increases the width and/or the depth of the recess 304.

In some implementations, the recess 304 may be formed using up to 15 cycles that include a wet etch process followed by an oxidation process (and optionally a cleaning process). By selecting more than 1 cycle, the recess 304 may be formed with a sufficient depth and/or width (e.g., as described above in connection with FIG. 3F). Etching the recess 304 to a sufficient depth reduces contact resistance between the conductive structure 238 and the conductive structure 244. By selecting no more than 15 cycles, the recess 304 is not etched too deep and/or too wide (e.g., as described above in connection with FIG. 3F). If the recess 304 were too deep or wide, the conductive structure 244 may have a low contact resistance that causes an electrical short.

Although described herein with respect to forming the recess 304 in the conductive structure 238 above the source/drain contact 230, the description similarly applies to forming the recess 304 in the conductive structure 244 above the conductive structure 238.

Figure 4F:
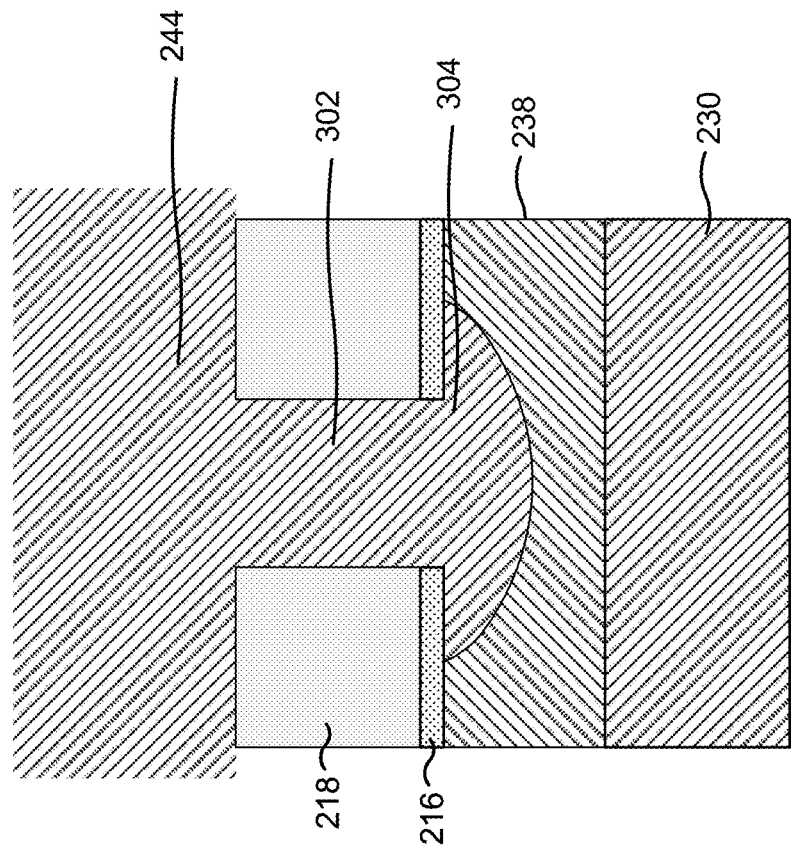

The conductive structure 244 may be formed in a recessed portion that includes the recess 302 and the recess 304, as shown in FIG. 4F. The conductive structure 244 may comprise a via, a metallization layer, and/or another conductive structure. Accordingly, the conductive structure 244 may be wider or less wide than the conductive structure 238. The deposition tool 102 may deposit the material of the conductive structure 244 using a CVD technique, a PVD technique, an ALD technique, or another type of deposition technique, the plating tool 112 may deposit the material of the conductive structure 244 using an electroplating operation, or a combination thereof. The planarization tool 110 may planarize the conductive structure 244 after the conductive structure 244 is deposited. In some implementations, the conductive structure 244 is additionally deposited to extend beyond a top surface of the oxide layer 218.

As indicated above, FIGS. 4A-4F are provided as one or more examples. Other examples may differ from what is described with regard to FIGS. 4A-4F.

Figure 5:
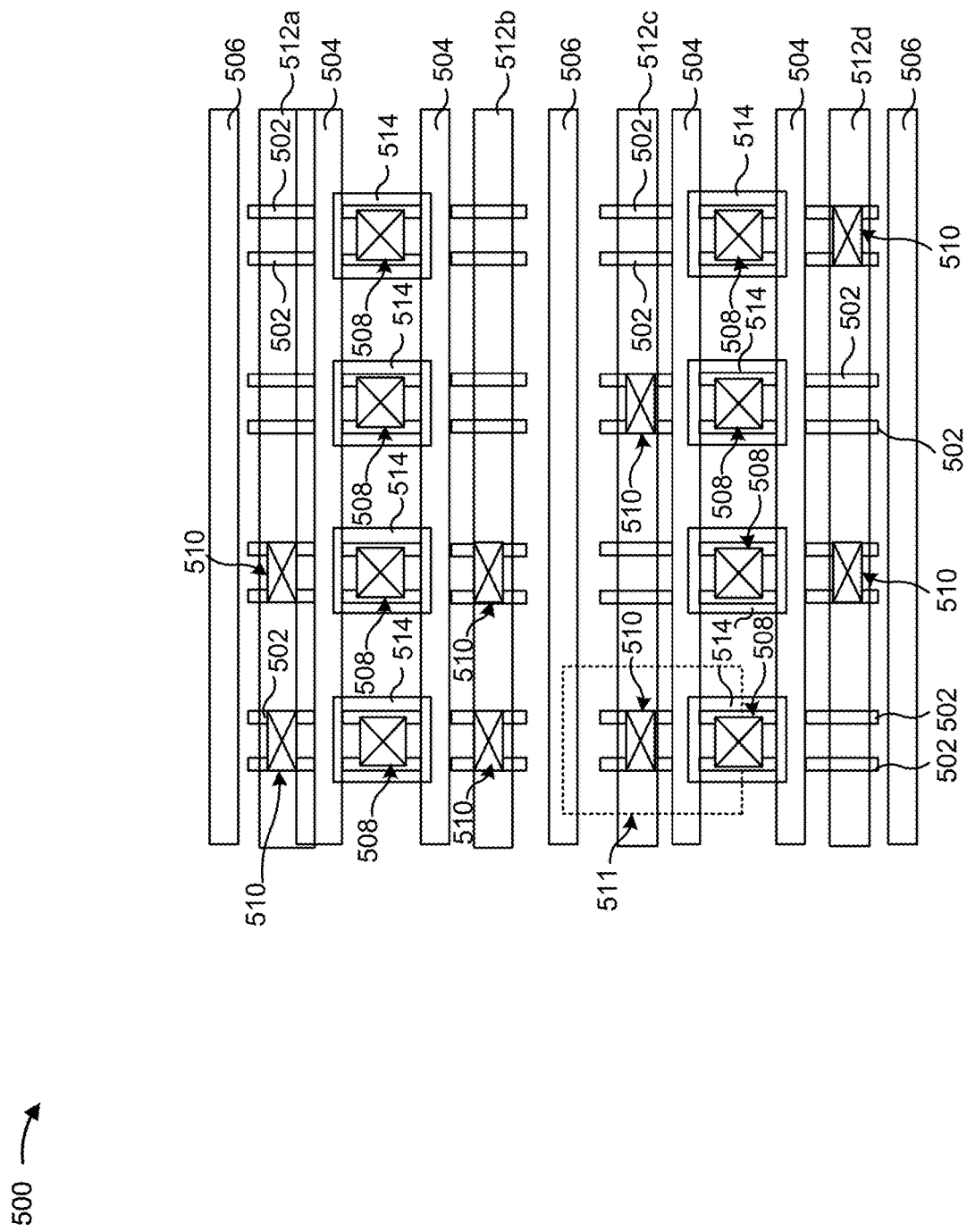
FIGS. 5 and 6 are diagrams of example devices incorporating example semiconductor structures described herein.

FIG. 5 is a diagram of an example read-only memory device 500 described herein. As shown in FIG. 5, the read-only memory device 500 includes active regions 502 (e.g., formed on a fin) with gates 504 formed on the active regions 502. Each gate 504 may extend to multiple read-only memory (ROM) cells.

In some implementations, the read-only memory device 500 further includes dummy gates 506 formed on isolation features (such as shallow trench isolation (STI) structures, spacers, and/or other isolation structures) in order to provide pattern uniformity, manufacturing enhancement, and/or device performance improvement. The dummy gates 506, similar to the gates 504, each may include a gate electrode (e.g., similar to gate 232).

As further shown in FIG. 5, the read-only memory device 500 includes drain contacts 508 (e.g., deposited on drain regions similar to epilayer 228) and source contacts 510 (e.g., deposited on source regions similar to epilayer 228).

The read-only memory device 500 includes an array of ROM cells. For example, ROM cell 511 is an example ROM cell that includes at least one source contact 508 and at least one drain contact 510. In some implementations, the ROM cell 511 is coded to a logic state "1" by providing the source contact 508. As an alternative, a ROM cell 511 is coded to a logic state "0" by refraining from forming the source contact 508. Accordingly, in FIG. 5, a subset of ROM cells in the array include source contacts 508. Therefore, a contact pattern or contact mask is designed for the read-only memory device 500 according to a ROM coding source.

As further shown in FIG. 5, the read-only memory device 500 further includes metal lines coupled to respective contacts. In some implementations, the read-only memory device 500 includes metal lines 512a, 512b, 512c, and 512d configured in parallel. In one example, the metal lines 512a through 512d are power source lines and are directly connected to the source contacts 510. Accordingly, the sources of ROM cells coded to the logic state "1" are electrically coupled to the power source. In some implementations, read-only memory device 500 further includes metal lines 514 connected to the drain contacts 508. Accordingly, the drains of the ROM cells are electrically coupled to a ground.

The read-only memory device 500 may be electrically connected to a BEOL metallization stack (not shown) of the read-only memory device 500. Accordingly, conductive structures may be formed on the gates 504 (or on gate contacts, such as gate contact 242, formed on the gates), the drain contacts 508, and/or the source contacts 510. The conductive structures may be formed as described herein in order to increase contact areas between the conductive structures and the gates 504, the drain contacts 508, or the source contacts 510, respectively. Increasing contact area reduces contact resistances at interfaces between the conductive structures and the gates 504, the drain contacts 508, or the source contacts 510, respectively. Additionally, the conductive structures may be formed as described herein in order to avoid damage to silicide layers below the gates 504, the drain contacts 508, or the source contacts 510, respectively, during wet etching processes. Furthermore, forming the conductive structures as described herein increases uniformity of size and shape among the conductive structures because unexpected wet etching of the gates 504, the drain contacts 508, or the source contacts 510, respectively, is avoided. Increased uniformity decreases a quantity of ROM cells that are defective, which reduces waste of manufacturing materials and allows for reduced chip size of the read-only memory device 500 because fewer ROM cells are needed to account for a lower defect rate.

Additionally, or alternatively, one or more components of the BEOL metallization stack (e.g., similar conductive structures 244 and/or 248) may be formed as described herein in order to increase contact areas between the BEOL components and the conductive structures in the MEOL. Increasing contact area reduces contact resistances at interfaces between the BEOL components and the conductive structures. Additionally, the BEOL components may be formed as described herein in order to avoid damage to layers below the conductive structures during wet etching processes. Furthermore, forming the BEOL components as described herein increases uniformity of size and shape among the BEOL components because unexpected wet etching of the conductive structures is avoided. Increased uniformity decreases a quantity of ROM cells that are defective, which reduces waste of manufacturing materials and allows for reduced chip size of the read-only memory device 500 because fewer ROM cells are needed to account for a lower defect rate.

The BEOL metallization stack may electrically connect the read-only memory device 500 to control circuitry that may be used to read data from the read-only memory device 500.

The number and arrangement of ROM cells shown in FIG. 5 are provided as one or more examples. In practice, there may be additional ROM cells, fewer ROM cells, or differently arranged ROM cells than those shown in FIG. 5.

Figure 6:
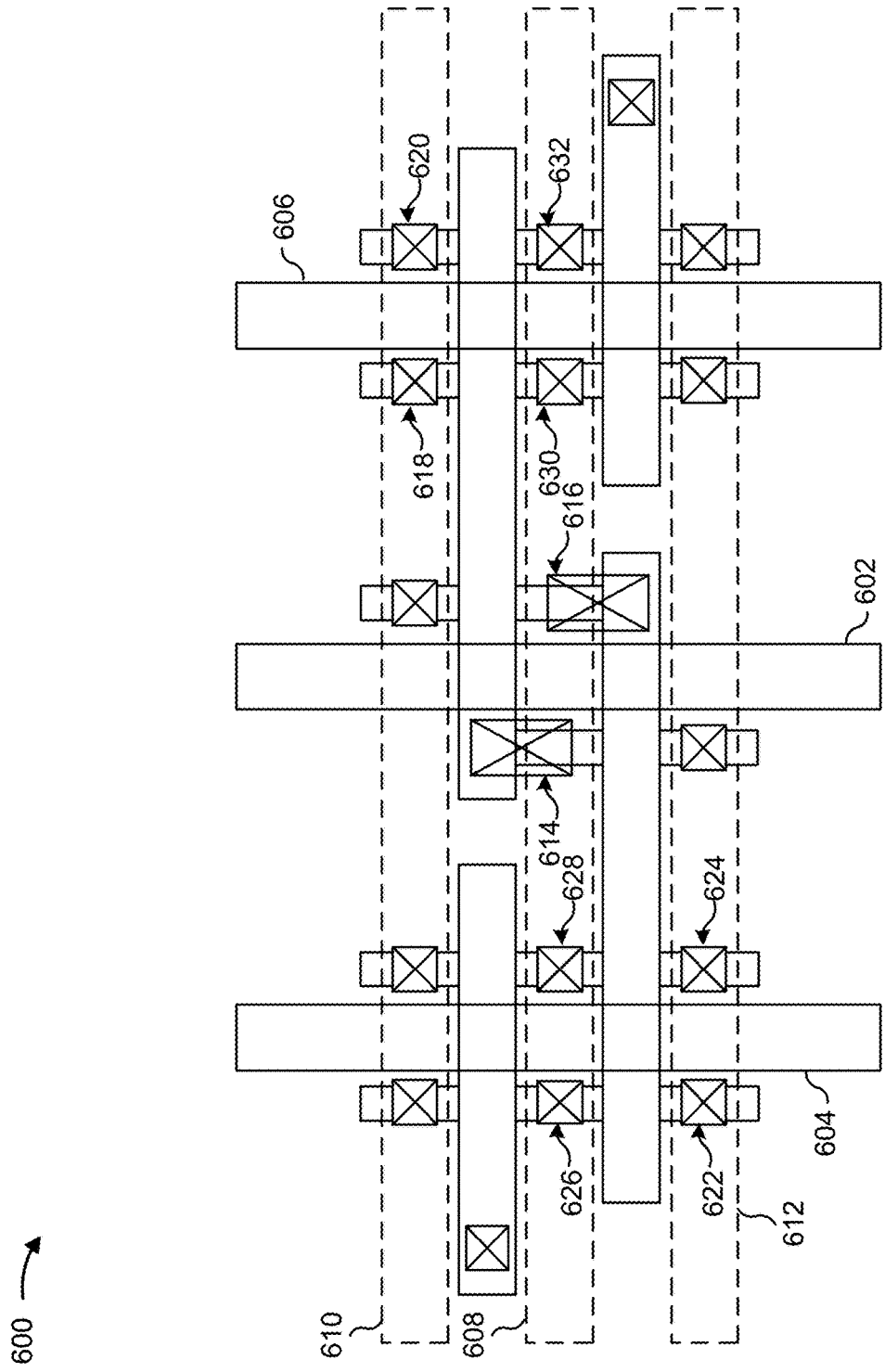

FIG. 6 is a diagram of an example random access memory device 600 described herein. The random access memory device 600 includes an SRAM cell.

As shown in FIG. 6, the SRAM cell includes interconnects, such as metal lines 602, 604, and 606. In some implementations, the metal line 602 is a power source line coupled to source contacts corresponding to drain contacts 614 and 616, the metal line 604 is coupled to drain contact 614, and the metal line 606 is coupled to drain contact 616. Additionally, or alternatively, the SRAM cell includes interconnects, such as metal lines 608, 610, and 612. In some implementations, the metal line 608 is coupled to gates 626, 628, 630, and 632, the metal line 610 is a power source line coupled to source contacts 618 and 620, and the metal line 612 is a power source line coupled to source contacts 622 and 624.

In some implementations, the SRAM cell is coded to a logic state "1" by applying a voltage to metal line 604 and grounding metal line 606. As an alternative, the SRAM cell is coded to a logic state "0" by applying a voltage to metal line 606 and grounding metal line 604. The stored logic state may be read using metal line 608. For example, the stored logic state may be read using a pull down operation with metal lines 604 and 606 as well as metal line 608.

The random access memory device 600 may be electrically connected to a BEOL metallization stack (not shown) of the random access memory device 600. Accordingly, conductive structures may be formed on the gates 626, 628, 630, and 632 (or on gate contacts, such as gate contact 242, formed on the gates), the drain contacts 614 and 616, and/or the source contacts 622 and 624. The conductive structures may be formed as described herein in order to increase contact areas between the conductive structures and the gates, the drain contacts, and/or the source contacts. Increasing contact areas reduces contact resistances at interfaces between the conductive structures and the gates, the drain contacts, and/or the source contacts. Additionally, the conductive structures may be formed as described herein in order to avoid damage to layers of silicide below the gates, the drain contacts, and/or the source contacts during wet etching processes. Furthermore, forming the conductive structures as described herein increases uniformity of size and shape among the conductive structures because unexpected wet etching of the gates, the drain contacts, and/or the source contacts is avoided. Increased uniformity decreases a quantity of SRAM cells that are defective, which reduces waste of manufacturing materials and allows for reduced chip size of the random access memory device 600 because fewer SRAM cells are needed to account for a lower defect rate.

Additionally, or alternatively, one or more components of the BEOL metallization stack (e.g., similar conductive structures 244 and/or 248) may be formed as described herein in order to increase contact areas between the BEOL components and the conductive structures in the MEOL. Increasing contact area reduces contact resistances at interfaces between the BEOL components and the conductive structures. Additionally, the BEOL components may be formed as described herein in order to avoid damage to layers below the conductive structures during wet etching processes. Furthermore, forming the BEOL components as described herein increases uniformity of size and shape among the BEOL components because unexpected wet etching of the conductive structures is avoided. Increased uniformity decreases a quantity of SRAM cells that are defective, which reduces waste of manufacturing materials and allows for reduced chip size of the random access memory device 600 because fewer SRAM cells are needed to account for a lower defect rate.

The BEOL metallization stack may electrically connect the random access memory device 600 to control circuitry that may be used to write data to and read data from the random access memory device 600.

The number and arrangement of the SRAM cell shown in FIG. 6 is provided as an example. In practice, there may be additional cells or differently arranged cells than that shown in FIG. 6.

Figure 7:
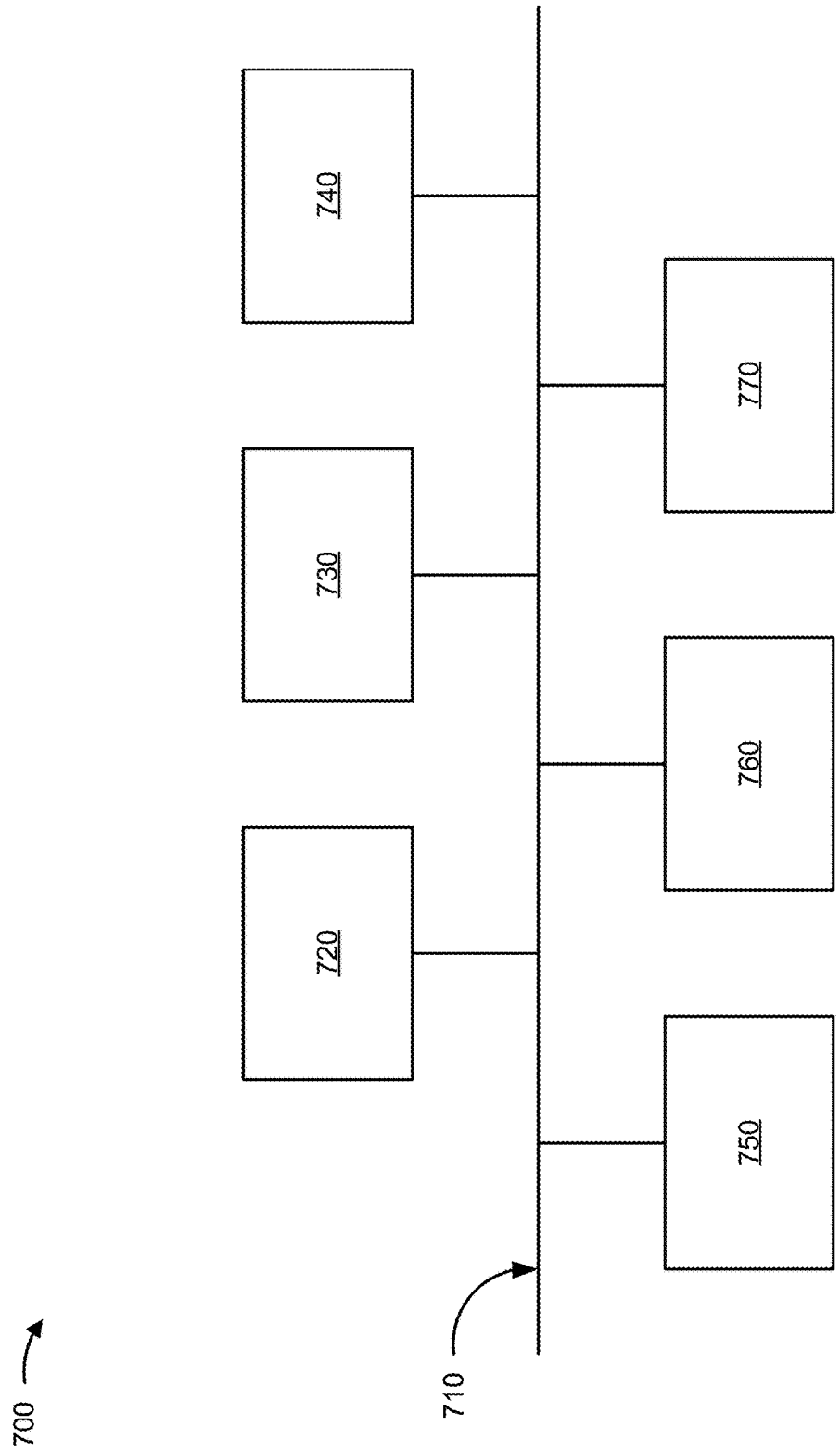
FIG. 7 is a diagram of example components of one or more devices of FIG. 1 described herein.

FIG. 7 is a diagram of example components of a device 700. In some implementations, one or more of the semiconductor processing tools 102-114 and/or the wafer/die transport tool 116 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
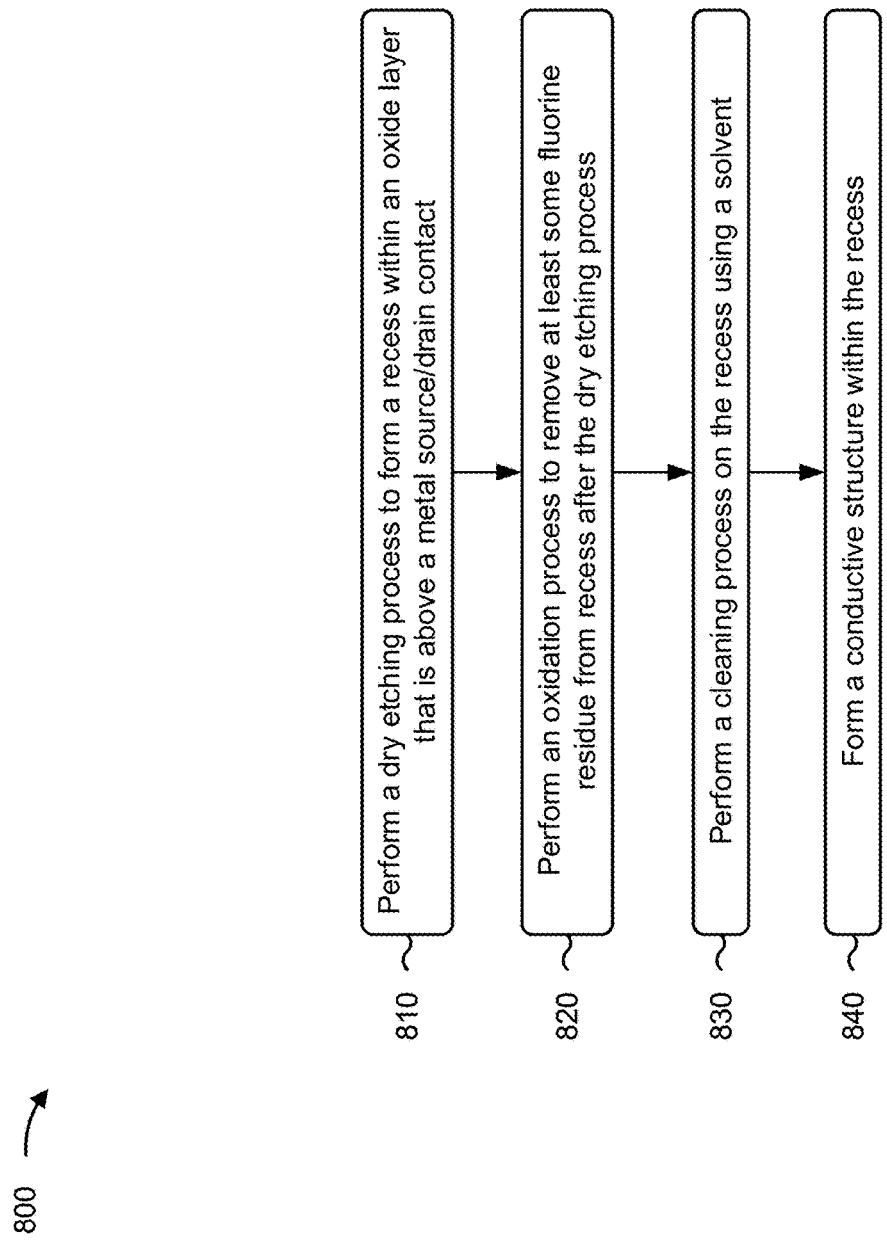
FIG. 8 is a flowchart of an example process relating to forming a semiconductor structure described herein.

FIG. 8 is a flowchart of an example process 800 associated with oxidation to mitigate dry etch residue. In some implementations, one or more process blocks of FIG. 8 may be performed by one or more semiconductor processing tools (e.g., one or more of the semiconductor processing tools 102-114). Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include performing a dry etching process to form a recess within an oxide layer that is above a source/drain contact (block 810). For example, the one or more semiconductor processing tools 102-114 may perform a dry etching process to form a recess 302 within an oxide layer 214 that is above a source/drain contact 230, as described herein. In some implementations, the dry etching process results in fluorine residue in the recess.

As further shown in FIG. 8, process 800 may include performing an oxidation process to remove the fluorine residue from the recess after the dry etching process (block 820). For example, the one or more semiconductor processing tools 102-114 may perform an oxidation process to remove the fluorine residue from the recess 302 after the dry etching process, as described herein.

As further shown in FIG. 8, process 800 may include performing a cleaning process on the recess using a solvent after removing the fluorine residue from the recess (block 830). For example, the one or more semiconductor processing tools 102-114 may perform a cleaning process on the recess 302 using a solvent after removing the fluorine residue from the recess 302, as described herein.

As further shown in FIG. 8, process 800 may include forming a conductive structure within the recess after performing the cleaning process (block 840). For example, the one or more semiconductor processing tools 102-114 may form a conductive structure 238 within the recess 302 after performing the cleaning process, as described herein.

Process 800 may include additional implementations, such as any single implementation or any combination of implementations described below and/or in connection with one or more other processes described elsewhere herein.

In a first implementation, the dry etching process is performed using fluorine in a concentration in a range from approximately 10 sccm to approximately 80 sccm, and for an amount of time in a range from approximately 20 minutes to approximately 60 minutes. In a second implementation, alone or in combination with the first implementation, the cleaning process is performed using water, hydrogen peroxide, or a combination thereof, and for an amount of time in a range from approximately 5 minutes to approximately 10 minutes.

In a third implementation, alone or in combination with one or more of the first and second implementations, the oxidation process is performed for an amount of time in a range from approximately 1 minute to approximately 5 minutes. In a fourth implementation, alone or in combination with one or more of the first through third implementations, the oxidation process is performed using an oxidizing agent select from ozone, an ammonia and hydrogen peroxide mixture, an ammonia and ozone mixture, or an organic oxidizing agent, and the oxidizing agent is used in a concentration in a range from approximately 5% to approximately 60%.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Figure 9:
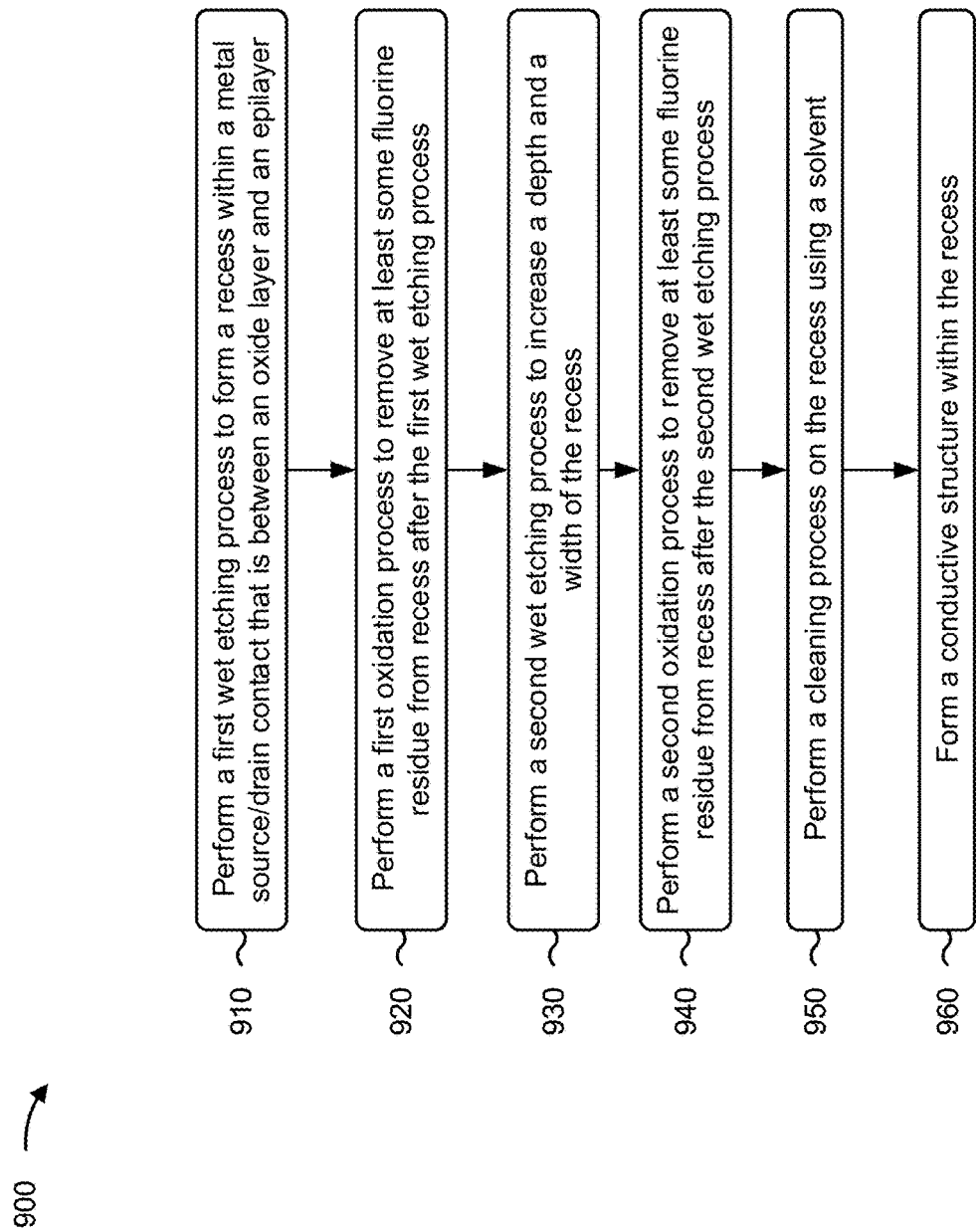
FIG. 9 is a flowchart of an example process relating to forming a semiconductor structure described herein.

FIG. 9 is a flowchart of an example process 900 associated with oxidation to mitigate wet etch residue. In some implementations, one or more process blocks of FIG. 9 may be performed by one or more semiconductor processing tools (e.g., one or more of the semiconductor processing tools 102-114). Additionally, or alternatively, one or more process blocks of FIG. 9 may be performed by one or more components of device 700, such as processor 720, memory 730, storage component 740, input component 750, output component 760, and/or communication component 770.

As shown in FIG. 9, process 900 may include performing a first wet etching process to form a recess within a source/drain contact that is between an oxide layer and an epilayer (block 910). For example, the one or more semiconductor processing tools 102-114 may perform a first wet etching process to form a recess 304 within a source/drain contact 230 that is between an oxide layer 214 and an epilayer 228, as described herein. In some implementations, the first wet etching process results in fluorine residue in the recess.

As further shown in FIG. 9, process 900 may include performing a first oxidation process to remove the fluorine residue from the recess (block 920). For example, the one or more semiconductor processing tools 102-114 may perform a first oxidation process to remove the fluorine residue from the recess, as described herein.

As further shown in FIG. 9, process 900 may include performing a second wet etching process to increase a depth and a width of the recess after removing the fluorine residue from the recess (block 930). For example, the one or more semiconductor processing tools 102-114 may perform a second wet etching process to increase a depth and a width of the recess 304 after removing the fluorine residue from the recess 304, as described herein. In some implementations, the second wet etching process results in additional fluorine residue in the recess.

As further shown in FIG. 9, process 900 may include performing a second oxidation process to remove the additional fluorine residue from the recess (block 940). For example, the one or more semiconductor processing tools 102-114 may perform a second oxidation process to remove the additional fluorine residue from the recess 304, as described herein.

As further shown in FIG. 9, process 900 may include performing a cleaning process on the recess using a solvent after removing the additional fluorine residue from the recess (block 950). For example, the one or more semiconductor processing tools 102-114 may perform a cleaning process on the recess 304 using a solvent after removing the additional fluorine residue from the recess, as described herein.

As further shown in FIG. 9, process 900 may include forming a conductive structure within the recess after the cleaning process (block 960). For example, the one or more semiconductor processing tools 102-114 may form a conductive structure 238 within the recess 304 after the cleaning process, as described above.

Process 900 may include additional implementations, such as any single implementation or any combination of implementations described below and/or in connection with one or more other processes described elsewhere herein.

In a first implementation, the first wet etching process is performed using hydrofluoric acid and for an amount of time in a range from approximately 5 minutes to approximately 15 minutes. In a second implementation, alone or in combination with the first implementation, process 900 further includes performing an additional cleaning process on the recess 304 after the first oxidation process and before the second wet etching process.

In a third implementation, alone or in combination with one or more of the first and second implementations, process 900 further includes performing a dry etching process to form an recess 302 within the oxide layer 214, and the first wet etching process is performed by providing an etchant through the recess 302 to contact the source/drain contact 230. In a fourth implementation, alone or in combination with one or more of the first through third implementations, the dry etching process results in fluorine residue in the recess 302, and process 900 further includes performing an additional oxidation process to remove the fluorine residue from the recess 302 before performing the first wet etching process.

In a fifth implementation, alone or in combination with one or more of the first through fourth implementations, process 900 further includes performing a third wet etching process to further increase the depth and the width of the recess 304, where the third wet etching process results in further fluorine residue in the recess 304, and performing a third oxidation process to remove the further fluorine residue from the recess 304 after the third wet etching process. In a sixth implementation, alone or in combination with one or more of the first through fifth implementations, process 900 further includes performing an additional cleaning process on the recess 304 after the second oxidation process and before the third wet etching process.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, some implementations described herein reduce contact resistance at the conductive structure. In some implementations, the conductive structure is formed within a recessed portion of a source/drain contact with a depth to width ratio in a range from approximately 1.0 to approximately 1.4. This ratio improves performance of the corresponding channel by providing a large enough threshold voltage for the gate such that the gate turns on when expected and by providing a large enough maximum voltage such that the gate is not damaged during normal operation.

In some implementations, fluorine is oxidized (e.g., using ozone and/or another oxidizing agent) after dry etching an oxide layer above the source/drain contact and before cleaning (e.g., using water, hydrogen peroxide, or another solvent). Accordingly, less hydrofluoric acid is formed during cleaning, which reduces unexpected wet etching of the source/drain contact. This allows for forming the recessed portion with the depth to width ratio described above and prevents damage to a layer of silicide below the source/drain contact that can be caused by excessive hydrofluoric acid. Additionally, or alternatively, in some implementations, the recessed portion is formed using multiple wet etch processes, and any residual fluorine is oxidized (e.g., using ozone and/or another oxidizing agent) between the wet etch processes. Accordingly, each wet etching process may be shorter and less corrosive, which allows for greater control over dimensions of the recessed portion. Additionally, less hydrofluoric acid may be formed during cleaning processes between the wet etch processes, which reduces the etching of the source/drain between processes. This also allows for forming the recessed portion with the depth to width ratio described above and prevents damage to the layer of silicide that can be caused by excessive hydrofluoric acid.

As described in greater detail above, some implementations described herein provide a method. The method includes performing a dry etching process to form a recess within an oxide layer that is above a source/drain contact, where the dry etching process results in fluorine residue in the recess. The method further includes performing an oxidation process to remove the fluorine residue from the recess after the dry etching process. The method includes performing a cleaning process on the recess using a solvent after removing the fluorine residue from the recess. The method further includes forming a conductive structure within the recess after performing the cleaning process.

As described in greater detail above, some implementations described herein provide a semiconductor structure. The semiconductor structure includes a source/drain contact formed on an epilayer. The semiconductor structure further includes an oxide layer formed on the source/drain contact. The semiconductor structure includes a conductive structure formed in a recessed portion of the source/drain contact, where the recessed portion has a depth and a width, and a ratio of the depth to the width is in a range from approximately 1.0 to approximately 1.4.

As described in greater detail above, some implementations described herein provide a method. The method includes performing a first wet etching process to form a recess within a source/drain contact that is between an oxide layer and an epilayer, where the first wet etching process results in fluorine residue in the recess. The method further includes performing a first oxidation process to remove the fluorine residue from the recess. The method includes performing a second wet etching process to increase a depth and a width of the recess after removing the fluorine residue from the recess, where the second wet etching process results in additional fluorine residue in the recess. The method further includes performing a second oxidation process to remove the additional fluorine residue from the recess. The method includes performing a cleaning process on the recess using a solvent after removing the additional fluorine residue from the recess. The method further includes forming a conductive structure within the recess after the cleaning process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a dry etching process using a fluorine (F) plasma to form a recess within an oxide layer that is above a source/drain contact,
wherein the dry etching process results in fluorine residue in the recess;
performing an oxidation process to remove the fluorine residue from the recess after the dry etching process;
performing a cleaning process on the recess using a solvent after removing the fluorine residue from the recess; and
forming a conductive structure within the recess after performing the cleaning process.

2. The method of claim 1, wherein the fluorine residue comprises metal fluoride within the recess, and the oxidation process causes the metal fluoride to react with oxygen to form oxygen fluoride.

3. The method of claim 1, wherein the cleaning process is performed using water, hydrogen peroxide, or a combination thereof, and for an amount of time in a range from approximately 5 minutes to approximately 10 minutes.

4. The method of claim 1, wherein the oxidation process is performed for an amount of time in a range from approximately 1 minute to approximately 5 minutes.

5. The method of claim 1, wherein the oxidation process is performed using an oxidizing agent selected from ozone, an ammonia and hydrogen peroxide mixture, an ammonia and ozone mixture, or an organic oxidizing agent, and the oxidizing agent is used in a concentration in a range from approximately 5% to approximately 60%.

6. A method, comprising:
performing a first wet etching process using a fluorine (F) plasma to form a recess within a source/drain contact that is between an oxide layer and an epilayer,
wherein the first wet etching process results in first fluorine residue in the recess;
performing a first oxidation process to remove the first fluorine residue from the recess;
performing a second wet etching process using the fluorine (F) plasma to increase a depth and a width of the recess after removing the first fluorine residue from the recess,
wherein the second wet etching process results in second fluorine residue in the recess;
performing a second oxidation process to remove the second fluorine residue from the recess;
performing a cleaning process on the recess using a solvent after removing the second fluorine residue from the recess; and
forming a conductive structure within the recess after the cleaning process.

7. The method of claim 6, wherein the first fluorine residue and the second fluorine residue comprise metal fluoride within the recess, and the first oxidation process and the second oxidation process cause the metal fluoride to react with oxygen to form oxygen fluoride.

8. The method of claim 6, further comprising:
performing an additional cleaning process on the recess after the first oxidation process and before the second wet etching process.

9. The method of claim 6, further comprising:
performing a dry etching process to form an opening within the oxide layer,
wherein the first wet etching process is performed by providing an etchant through the opening to contact the source/drain contact.

10. The method of claim 9, wherein the dry etching process results in third fluorine residue in the opening, and the method further comprises:
performing an additional oxidation process to remove the third fluorine residue from the opening before performing the first wet etching process.

11. The method of claim 6, further comprising:
performing a third wet etching process to further increase the depth and the width of the recess,
wherein the third wet etching process results in third fluorine residue in the recess; and
performing a third oxidation process to remove the third fluorine residue from the recess after the third wet etching process.

12. The method of claim 11, further comprising:
performing an additional cleaning process on the recess after the second oxidation process and before the third wet etching process.

13. A method, comprising:
performing a first etching process using a fluorine (F) plasma to form a recess within an oxide layer that is above a source/drain contact,
wherein the first etching process results in fluorine residue in the recess;
performing a first oxidation process to remove the fluorine residue from the recess;
performing a second etching process using the fluorine (F) plasma to increase a depth and a width of the recess after removing the fluorine residue from the recess,
wherein the second etching process results in additional fluorine residue in the recess;
performing a second oxidation process to remove the additional fluorine residue from the recess;
performing a cleaning process on the recess using a solvent after removing the additional fluorine residue from the recess; and
forming a conductive structure within the recess after the cleaning process.

14. The method of claim 13, wherein the first etching process is a dry etching process.

15. The method of claim 14, wherein the first etching process is performed using a plasma.

16. The method of claim 13, wherein the second etching process is a wet etching process.

17. The method of claim 13, wherein a portion of the recess has a depth to width ratio in a range from approximately 1.0 to approximately 1.4 after performing the cleaning process.

18. The method of claim 17, wherein another portion of the recess has a width to depth ratio in a range from approximately 1.0 to approximately 1.6 after performing the cleaning process.

19. The method of claim 13, wherein a first portion of the recess is associated with a first curve angle relative to an axis that is parallel with a bottom surface of the oxide layer, and
wherein a second portion of the recess is associated with a second curve angle relative to the axis.

20. The method of claim 19, wherein a difference between the first curve angle and the second curve angle is within a range from approximately 10 degrees to approximately 30 degrees.

* * * * *